(12) United States Patent
Briggs et al.

(10) Patent No.: US 9,916,986 B2
(45) Date of Patent: Mar. 13, 2018

(54) SINGLE OR MUTLI BLOCK MASK MANAGEMENT FOR SPACER HEIGHT AND DEFECT REDUCTION FOR BEOL

(71) Applicant: INTERNATIONAL BUSINESS MACHINES CORPORATION, Armonk, NY (US)

(72) Inventors: Benjamin D. Briggs, Waterford, NY (US); Lawrence A. Clevenger, Rhinebeck, NY (US); Yann A. Mignot, Slingerlands, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 50 days.

(21) Appl. No.: 15/193,759

(22) Filed: Jun. 27, 2016

(65) Prior Publication Data

US 2017/0372909 A1 Dec. 28, 2017

(51) Int. Cl.
| | |
|---|---|
| *H01L 21/31* | (2006.01) |
| *H01L 21/30* | (2006.01) |
| *H01L 21/46* | (2006.01) |
| *H01L 21/44* | (2006.01) |
| *H01L 21/3065* | (2006.01) |
| *H01L 21/027* | (2006.01) |
| *H01L 21/033* | (2006.01) |
| *H01L 21/3105* | (2006.01) |
| *H01L 21/02* | (2006.01) |

(52) U.S. Cl.
CPC ...... *H01L 21/3065* (2013.01); *H01L 21/0271* (2013.01); *H01L 21/02123* (2013.01); *H01L 21/0332* (2013.01); *H01L 21/0337* (2013.01); *H01L 21/3105* (2013.01)

(58) Field of Classification Search
CPC ......... H01L 21/30; H01L 21/02; H01L 21/03; H01L 21/31
USPC ....... 438/699, 667, 694, 692, 704, 669, 672, 438/688; 257/774, E23.01
See application file for complete search history.

(56) References Cited

U.S. PATENT DOCUMENTS

| | | | |
|---|---|---|---|
| 6,277,544 B1 | 8/2001 | Singh et al. | |
| 6,780,736 B1 | 8/2004 | Holmes et al. | |
| 8,138,097 B1 | 3/2012 | Isobayashi et al. | |
| 8,298,943 B1 * | 10/2012 | Arnold | H01L 21/0337 438/667 |
| 8,470,711 B2 | 6/2013 | Arnold et al. | |
| 8,686,417 B2 | 4/2014 | Suzawa et al. | |

(Continued)

*Primary Examiner* — Sheikh Maruf
(74) *Attorney, Agent, or Firm* — Cantor Colburn LLP

(57) ABSTRACT

Aspects of the disclosure include method of making semiconductor structures. Aspects include providing a semiconductor structure including a plurality of spacer, an organic planarization layer, and a SiARC layer. Aspects also include forming an inverted mask on the semiconductor structure, the inverted mask including an inverted mask opening above a portion of the plurality of spacers and a portion of the TiN layer. Aspects also include eroding the portion of the plurality of spacers below the inverted mask opening. Aspects also include depositing a fill material masking the portion of the plurality of spacers below the inverted mask opening and the portion of the TiN layer below the inverted mask opening to generate a masked TiN layer segment and an unmasked TiN layer segment and removing a portion of the unmasked TiN layer segment.

20 Claims, 30 Drawing Sheets

(56) References Cited

U.S. PATENT DOCUMENTS

| | | | |
|---|---|---|---|
| 8,709,946 B2* | 4/2014 | Tsai | H01L 21/76816 438/668 |
| 8,771,929 B2 | 7/2014 | Guillorn et al. | |
| 8,921,030 B2 | 12/2014 | Guillorn et al. | |
| 9,041,164 B2* | 5/2015 | Gronheid | G03F 7/091 148/33.3 |
| 9,054,160 B2 | 6/2015 | Bruce et al. | |
| 9,478,462 B1* | 10/2016 | Wang | H01L 21/76898 |
| 2002/0047153 A1* | 4/2002 | Nakamura | H01L 21/28518 257/306 |
| 2005/0023702 A1* | 2/2005 | Nishimura | H01L 21/28556 257/774 |
| 2009/0140438 A1* | 6/2009 | Yamazaki | G02F 1/13458 257/776 |
| 2010/0001402 A1 | 1/2010 | Meyer | |
| 2011/0049680 A1* | 3/2011 | Burns | G03F 7/0035 257/618 |
| 2011/0111596 A1* | 5/2011 | Kanakasabapathy | H01L 21/0337 438/694 |
| 2011/0130007 A1* | 6/2011 | Ching | H01J 37/32862 438/710 |
| 2012/0091591 A1* | 4/2012 | Gotoh | H01L 27/12 257/765 |
| 2012/0276694 A1* | 11/2012 | Koezuka | H01L 29/7869 438/151 |
| 2013/0005147 A1* | 1/2013 | Angyal | H01L 21/31116 438/692 |
| 2013/0026639 A1* | 1/2013 | Arnold | H01L 21/0274 257/773 |
| 2013/0032949 A1* | 2/2013 | Lin | H01L 23/5222 257/774 |
| 2013/0175658 A1 | 7/2013 | Arnold et al. | |
| 2014/0148012 A1* | 5/2014 | Guillorn | B81C 1/00031 438/700 |
| 2014/0170853 A1* | 6/2014 | Shamma | H01L 21/02115 438/699 |
| 2014/0239454 A1* | 8/2014 | Cai | H01L 21/02002 257/619 |
| 2015/0287610 A1* | 10/2015 | Abatchev | H01L 21/0337 438/692 |
| 2015/0303273 A1* | 10/2015 | Bouche | H01L 29/785 257/365 |
| 2016/0203991 A1* | 7/2016 | Chang | H01L 21/3086 438/699 |
| 2016/0293419 A1* | 10/2016 | Nam | H01L 23/528 |

\* cited by examiner

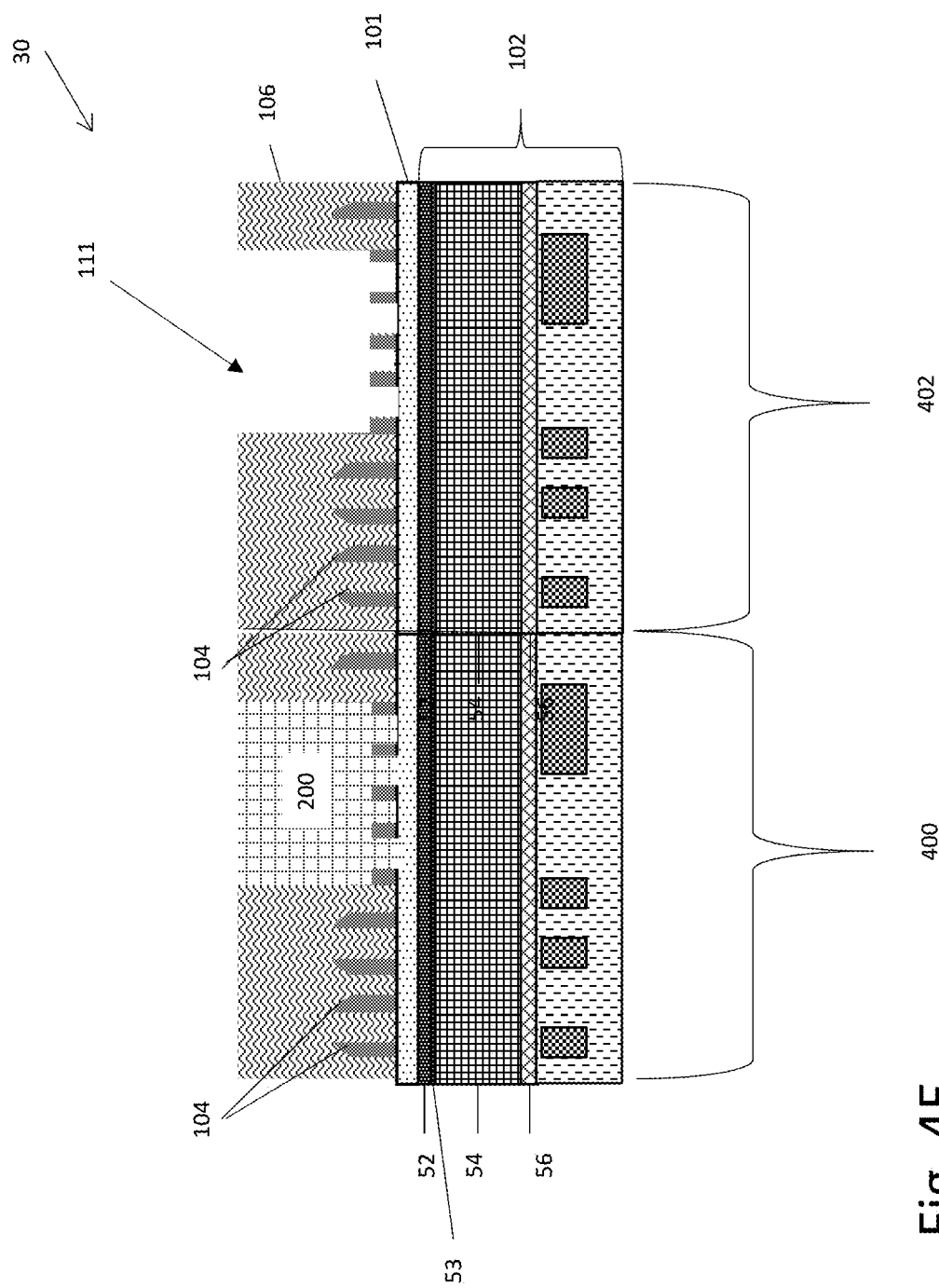

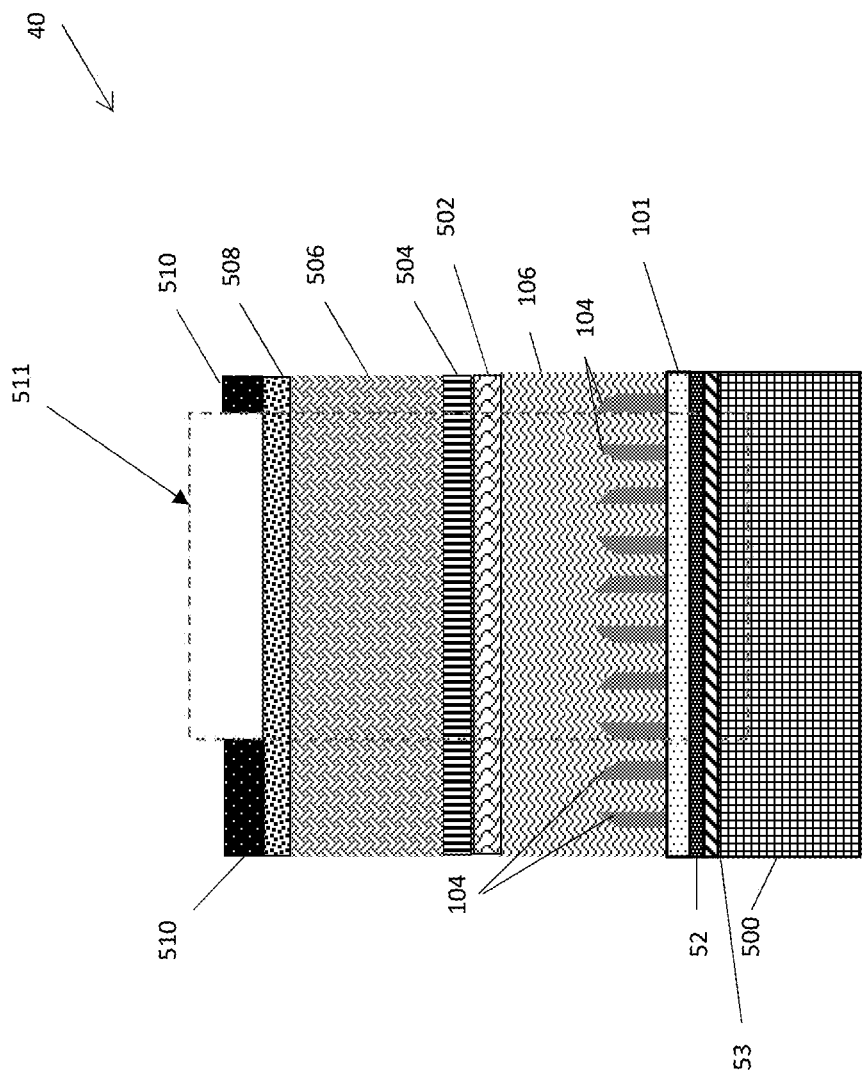

SINGLE OR MUTLI BLOCK MASK MANAGEMENT FOR SPACER HEIGHT AND DEFECT REDUCTION FOR BEOL

BACKGROUND

The present invention relates to formation of back end of the line (BEOL) interconnect structures in integrated circuits, and more specifically, to improved methods for BEOL processes with improved spacer height and defect reduction.

Back-end-of-line (BEOL) interconnect structures are used to electrically connect the device structures fabricated on the substrate during front-end-of-line (FEOL) processing. BEOL processes can involve complex patterning schemes, including multiple patterning schemes. Such patterning schemes can result in formation of spacers with differing and potentially detrimentally tall heights, which can adversely affect product reliability.

SUMMARY

In accordance with one or more embodiments, a method of making a semiconductor structure includes providing a semiconductor structure including a plurality of spacers on top of a TiN (titanium nitride) layer, an organic planarization layer on top of the plurality of spacers, and a SiARC layer on top of the organic planarization layer. The method also includes forming an inverted mask on the semiconductor structure, the inverted mask including an inverted mask opening above a portion of the plurality of spacers and a portion of the TiN layer. The method also includes eroding the portion of the plurality of spacers below the inverted mask opening. The method also includes depositing a fill material masking the portion of the plurality of spacers below the inverted mask opening and the portion of the TiN layer below the inverted mask opening to generate a masked TiN layer segment and an unmasked TiN layer segment. The method also includes removing a portion of the unmasked TiN layer segment.

In accordance with another embodiment, a method of making a semiconductor structure includes providing a first semiconductor block stack including a first plurality of spacers on top of a first TiN layer, a first organic planarization layer on top of the first plurality of spacers, and a first SiARC layer on top of the organic planarization layer. The method also includes forming a first inverted mask on the first semiconductor block stack, the first inverted mask including a first inverted mask opening. The method also includes eroding the portion of the plurality of spacers below the first inverted mask opening. The method also includes depositing a first fill material masking the portion of the first plurality of spacers below the first inverted mask opening. The method also includes providing a second semiconductor block stack comprising a second plurality of spacers on top of a second TiN layer and a second organic planarization layer on top of the second plurality of spacers. The method also includes depositing a second SiARC layer on top of the semiconductor structure. The method also includes forming a second inverted mask on the semiconductor structure, the second inverted mask including a second inverted mask opening. The method also includes eroding the portion of the plurality of spacers below the second inverted mask opening. The method also includes depositing a second fill material masking the portion of the second plurality of spacers below the second inverted mask opening.

In accordance with yet another embodiment, a method of making a semiconductor structure includes providing a semiconductor structure including a plurality of spacers on a bottom TiN layer. The method also includes depositing on the plurality of spacers: a bottom organic planarization layer, a top TiN layer, and an LTO mask, a top organic planarization layer, and a top SiARC layer. The method also includes patterning a first mask on the semiconductor structure, the first mask defining a first unmasked region. The method also includes opening the semiconductor structure to the top TiN layer in the first unmasked region and removing the top SiARC layer. The method also includes replacing the top organic planarization layer with a second top organic planarization layer. The method also includes depositing a second top SiARC layer on the semiconductor structure. The method also includes patterning a second mask on the semiconductor structure, the first mask and second mask defining a second unmasked region. The method also includes etching the bottom TiN layer in the second unmasked region.

BRIEF DESCRIPTION OF THE DRAWINGS

The subject matter of the present invention is particularly pointed out and distinctly claimed in the claims at the conclusion of the specification. The foregoing and other features and advantages of the one or more embodiments disclosed herein are apparent from the following detailed description taken in conjunction with the accompanying drawings in which:

FIGS. 1A-1C illustrate an exemplary conventional method of making a semiconductor including RIE patterning in a BEOL process, in which:

FIG. 1A is a cross-sectional view of a conventional semiconductor structure prior to SiARC removal;

FIG. 1B is a cross-sectional view of the conventional semiconductor structure of FIG. 1A after SiARC removal; and FIG. 1C is a cross-sectional view of the conventional semiconductor structure of FIG. 1A after opening of the TiN layer through RIE.

FIGS. 2A through 2C depict images of semiconductor structures in the exemplary process illustrated in FIGS. 1A-1C, in which:

FIG. 2A is an image of a conventional semiconductor structure prior to SiARC removal;

FIG. 2B is an image of a conventional semiconductor structure after SiARC removal; and FIG. 2C is an image of a conventional semiconductor structure after opening of the TiN layer through RIE.

FIGS. 3A-3G illustrate an exemplary method of making a semiconductor with an inverted mask according to one or more embodiments, in which;

FIG. 3A is a cross-sectional view of the exemplary semiconductor structure including an inverted mask;

FIG. 3B is a cross-sectional view of the exemplary semiconductor structure of after removing a portion of the SiARC layer and organic planarizing layer in the inverted mask opening;

FIG. 3C is a cross-sectional view of the exemplary semiconductor structure after removing the remaining SiARC layer and eroding the spacers in the inverted mask opening;

FIG. 3D is a cross-sectional view of the exemplary semiconductor structure after depositing a fill material;

FIG. 3E is a cross-sectional view of the exemplary semiconductor structure after removing the fill material to the top of the organic planarization layer;

FIG. 3F is a cross-sectional view of the exemplary semiconductor structure after removing the organic planarization layer;

FIG. 3G is a cross-sectional view of the exemplary semiconductor structure after etching the TiN layer.

FIGS. 4A-4F illustrate an exemplary method of making a semiconductor including block memorization according to one or more embodiments, in which:

FIG. 4A is a cross-sectional view of the exemplary semiconductor structure after removing a portion of a SiARC layer and organic planarizing layer in an inverted mask opening from a first block stack;

FIG. 4B is a cross-sectional view of the exemplary semiconductor structure after depositing a first fill material;

FIG. 4C is a cross-sectional view of the exemplary semiconductor structure after removing the fill material to the top of the organic planarization layer;

FIG. 4D is a cross-sectional view of the exemplary semiconductor structure after defining a second block stack;

FIG. 4E is a cross-sectional view of the exemplary semiconductor structure after removing a portion of a SiARC layer and organic planarizing layer in an inverted mask opening from the second block stack;

FIG. 4F is a cross-sectional view of the exemplary semiconductor structure after depositing a second fill material.

FIGS. 5A-5K illustrate another exemplary method of making a semiconductor including a block memorization layer according to one or more embodiments, in which:

FIG. 5A illustrates a cross-sectional view of the exemplary semiconductor including a first mask on a multi-layer structure;

FIG. 5B illustrates a cross-sectional view of the exemplary semiconductor structure after removing the top SiARC and top organic planarization layer in the first unmasked region;

FIG. 5C illustrates a cross-sectional view of the exemplary semiconductor structure after removing the top SiARC and LTO mask in the first unmasked region;

FIG. 5D illustrates a cross-sectional view of the exemplary semiconductor structure after removing the top organic planarization layer;

FIG. 5E illustrates a cross-sectional view of the exemplary semiconductor structure after adding a top organic planarization layer, top SiARC layer, and second mask;

FIG. 5F illustrates a cross-sectional view of the exemplary semiconductor structure after removing the top SiARC and top organic planarization layer in the second mask opening;

FIG. 5G illustrates a cross-sectional view of the exemplary semiconductor structure after removing a portion of the top TiN layer;

FIG. 5H a cross-sectional view of the exemplary semiconductor structure after removing the top SiARC and LTO mask in the second unmasked region;

FIG. 5I illustrates a cross-sectional view of the exemplary semiconductor structure after removing the top organic planarization layer and a portion of the second organic planarization layer;

FIG. 5J illustrates a cross-sectional view of the exemplary semiconductor structure after removing the top TiN layer and a portion of the bottom TiN layer; and FIG. 5K illustrates a cross-sectional view of the exemplary semiconductor structure after removing the organic planarization layer.

DETAILED DESCRIPTION

Figure 1A:
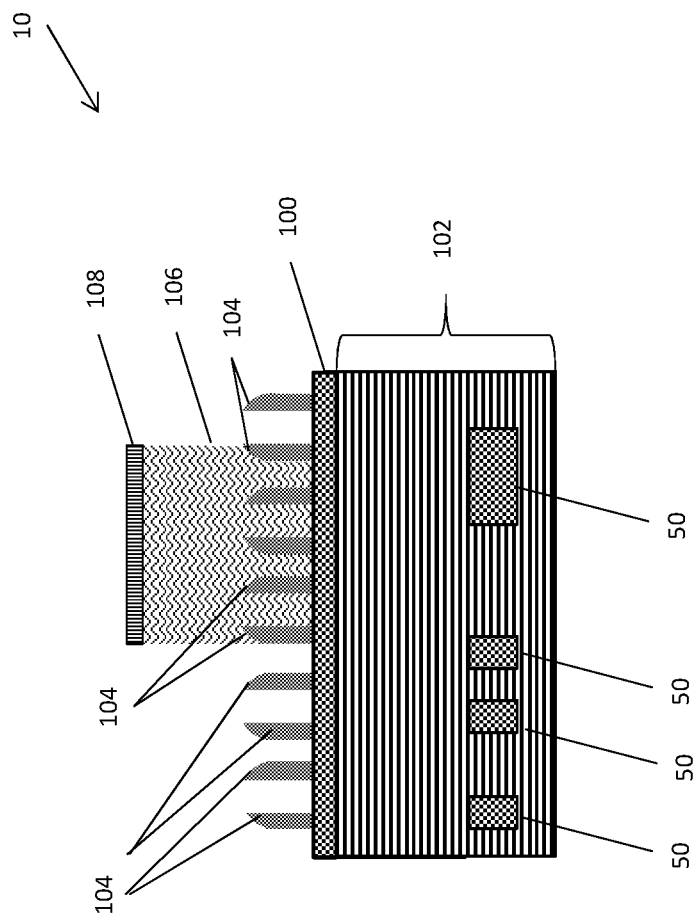

The invention relates to methods of fabricating semiconductor structures and, more particularly, to improved methods for BEOL processes using sidewall image transfer (SIT) or self-aligned quadruple patterning (SAQP) with improved spacer height. With continuous scale-down and shrinkage of real estate available for a single semiconductor device, engineers are daily facing the challenge of how to meet the market demand for ever increasing device density. Multiple patterning techniques, such as SIT and SAQP, are applicable for defining narrow gates at small lithographic pitches, including pitches less than 40 nanometers (nm).

SIT involves the usage of a sacrificial structure (e.g., a mandrel, typically composed of a polycrystalline silicon). A sidewall spacer (such as silicon dioxide or silicon nitride, $Si_3N_4$, for example) having a thickness less than that permitted by the current ground rules is formed on the sides of the mandrel (e.g., via oxidization or film deposition and etching). After removal of the mandrel, the remaining sidewall spacer is used as a hardmask to etch the layer(s) below, for example, with a directional reactive ion etching (RIE). Because the sidewall has a (sublithographic) width less than the ground rules, the structure formed in the layer below will also have a sublithographic width. In other uses, the sidewall may be used as a component in the desired structure (e.g., as a portion of the fins in a FinFET).

SIT BEOL processes conventionally employed a tall mandrel or spacer to accommodate RIE patterning. The tall spacers, however, can result in defects in the semiconductor device. Moreover, the tall spacers can undesirably reduce the local overlay margin and can cause further difficulties in manufacturer including SAQP, which is a multiple-patterning technique for obtaining a pitch, for instance, less than 40 nm.

With the advent of techniques such as SAQP comes the possibility of creating alternative patterning options with image reversal material (IRM). A technique for relatively small dimension pitch patterning and image reversal is brightfield imaging with a tone inversion process. Tone inversion can involve two separate resist exposures to double the pitch in some embodiments, followed by application of an etch selective, tone inversion overcoat material, also referred to as an IRM, which may be applied directly on patterned photoresist to transfer a brightfield image into the reverse tone. The IRM is then etched back after application. The tone inversion process may also include an antireflective coating (ARC) or a Silicon ARC (SiARC) located over an underlayer. The SiARC can be fully or partially removed. However, RIE patterning of the semiconductor device suffers from poor selectivity of the SiARC against the oxide spacer. As a result, varying spacer heights can result and become a source of defects in the semiconductor device. At the same time, in some cases the overlay margin can be reduced with a tall spacer and a block mask shape, leaving single islands, such as those resultant from conventional processes, prone to lift off.

Figure 1B:
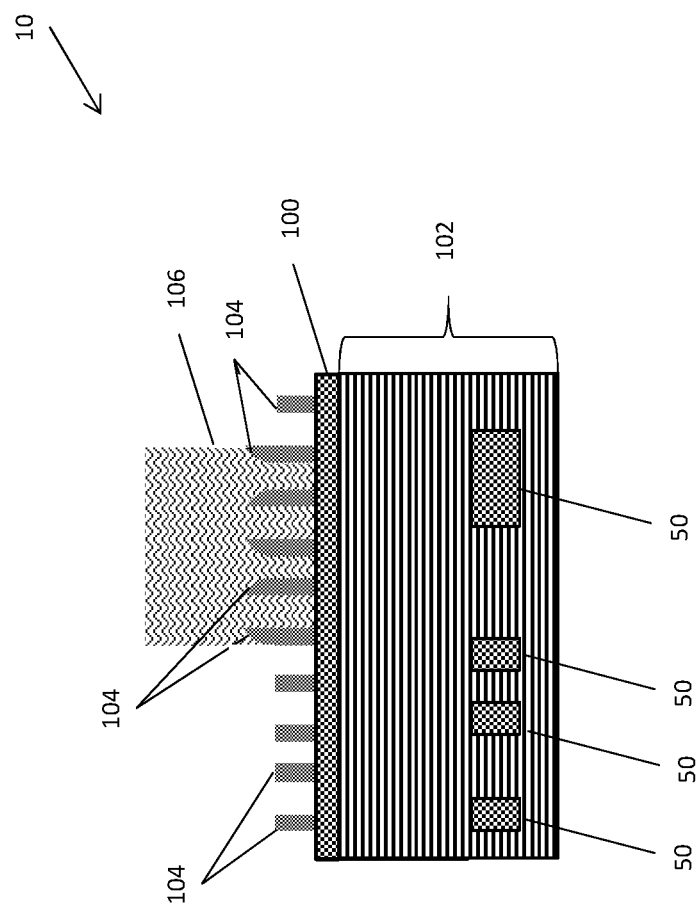
Figure 1C:
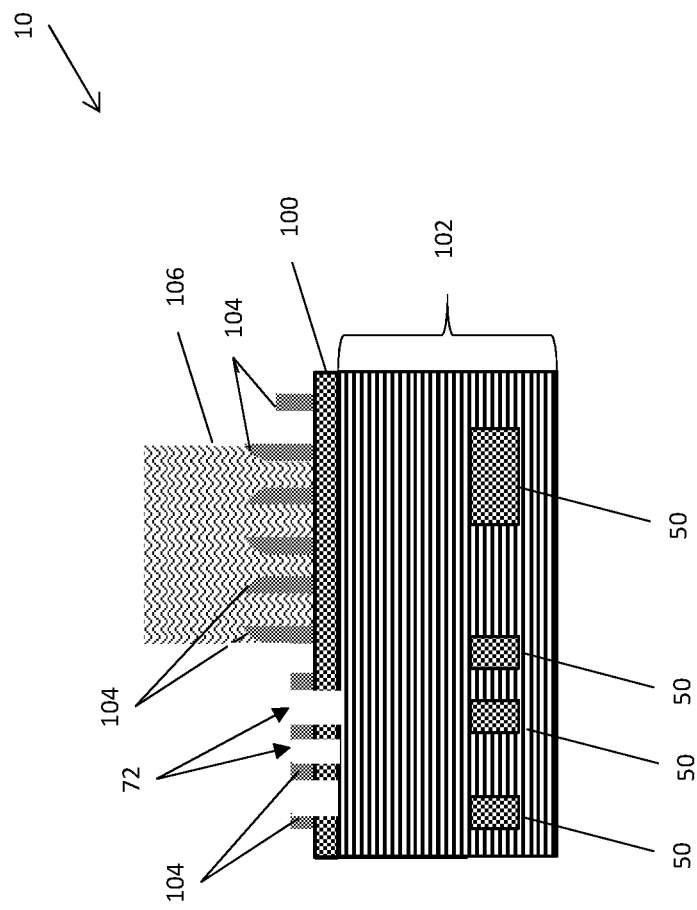

FIGS. 1A-1C illustrate an exemplary conventional method of making a semiconductor including RIE patterning in a BEOL process. As is shown in FIG. 1A, a semiconductor structure 10 includes spacers 104 patterned on a bottom titanium nitride (TiN) layer 100. The TiN layer can be deposited on a bottom semiconductor block 102, which can include, for example, a metallization layer 50. The metallization layer could include a core conductor, such as copper, tungsten or aluminum, and can have a liner on the sidewalls and a bottom surface of the core conductor, such as a liner composed of ruthenium (Ru), tantalum nitride (TaN), cobalt (Co), or aluminum (Al). A block including an organic planarization layer 106 and a SiARC layer 108 is positioned over some of the spacers 104. Then, as is illustrated in FIG. 1B, the SiARC layer 180 is removed. Because the SiARC removal agent can have poor selectivity against the oxide of the spacers 104, the spacers 104 can experience a height reduction during SiARC removal resulting in spacers 104 of differing heights. For example, spacers 104 with a starting height on the order of 80 nm can be reduced to a height on the order of 50 nm in areas not masked by the organic planarization layer 106. This height of the spacers 104 can be further reduced in subsequent processing of the semiconductor structure 10. For example, as is illustrated in FIG. 1C, the semiconductor structure 10 can be subsequently etched to remove portions of the TiN layer 100, for example to provide openings 72 to the bottom semiconductor block 102 in BEOL processes, which can further reduce the height of the spacers 104. For example, spacers on the order of 50 nm after removal of the SiARC can have a height on the order of 25 nm after removing portions of the TiN layer 100. Meanwhile, the spacers 104 under the organic planarization layer 106 remain at their original height.

Figure 2A:
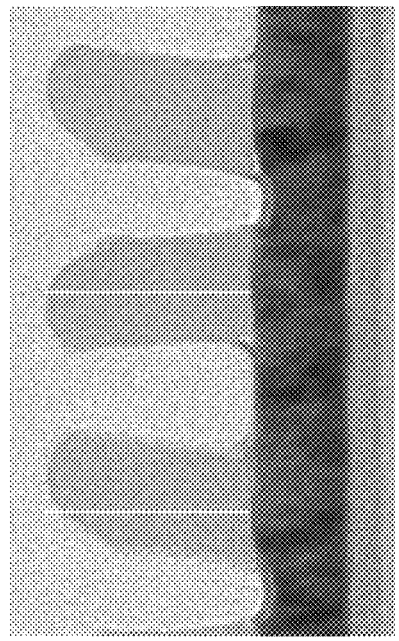
Figure 2B:
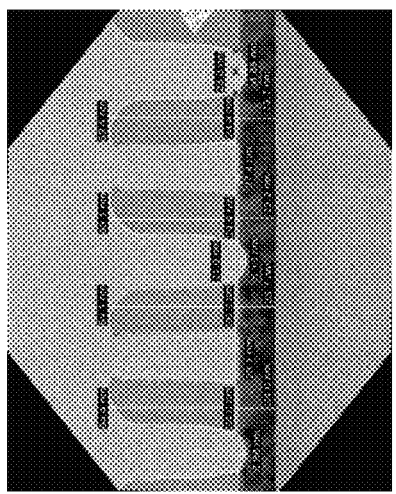
Figure 2C:
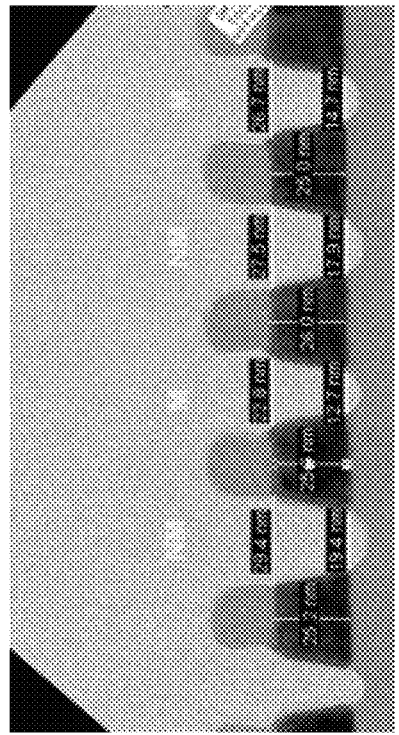

FIGS. 2A-2C depict images of semiconductor structures in the exemplary process illustrated in FIGS. 1A-1C. FIG. 2A is an image of a semiconductor structure corresponding to the process of FIG. 1A, showing a spacer height of 83-84 nm prior to SiARC removal. FIG. 2B is an image of the exposed spacers after SiARC removal in the exemplary process illustrated in FIG. 1B. The height of the spacers is reduced to around 50 nm. FIG. 2C is an image of the exposed spacers after RIE to remove portions of the TiN layer of the exemplary process illustrated in FIG. 1C, where the resultant spacer height is on the order of 25 nm.

Thus, in conventional methods, the resultant semiconductor device can have a section including undesirably tall spacers, which height is needed in exemplary conventional processes to compensate for losses of height during SiARC removal and TiN etching. The present invention provides embodiments with improved methods of forming semiconductor structures with improved spacer height in for multiple patterning BEOL processes.

Figure 3A:
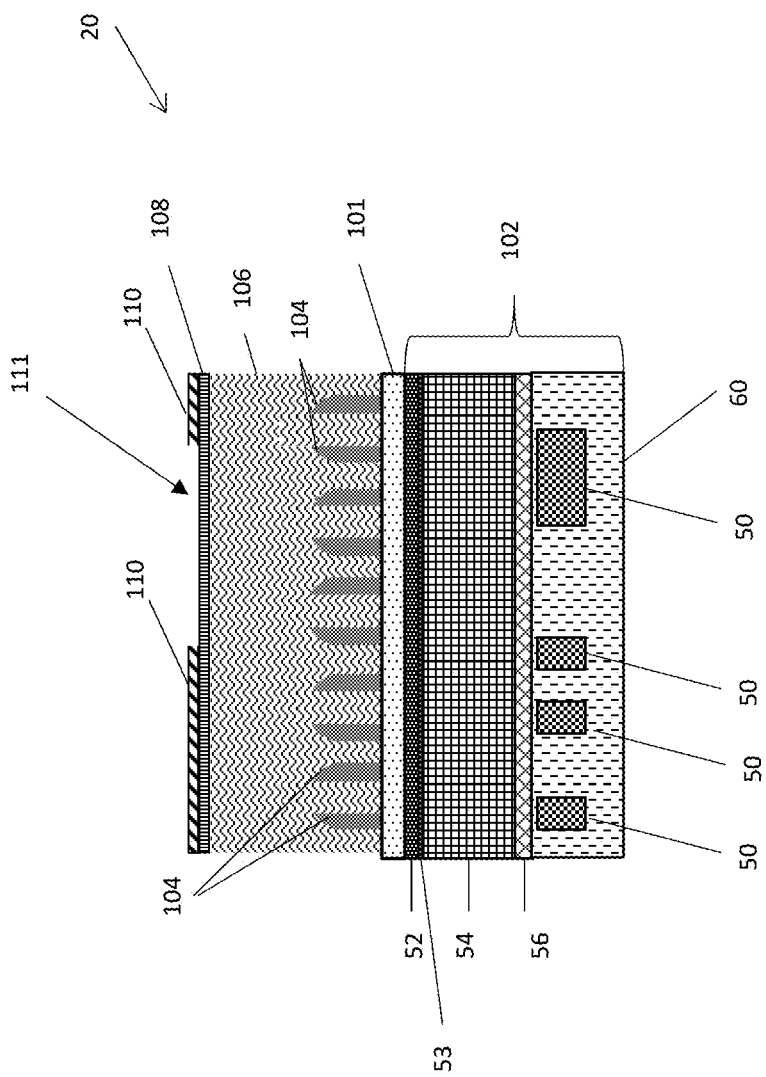

FIGS. 3A-3G illustrate an exemplary method of making a semiconductor with improved spacer height according to an embodiment. FIG. 3A is a cross-sectional view of the exemplary semiconductor structure 20 after forming an inverted mask 110. The structure 20 includes spacers 104 positioned on a metal hard mask layer 101, such as a TiN hardmask layer. The metal hardmask layer 101 can have a thickness, for instance, of 15-30 nm.

In one embodiment, the structure includes a bottom block 102. In one embodiment, the bottom block includes a first hardmask 52 under the metal hardmask layer 101. In one embodiment, the first hardmask 52 is an oxide material, such as tetraethyl orthosilicate (TEOS). In some embodiments, the bottom block 102 includes a second hardmask layer 53. In an embodiment, second hardmask layer 53 is an oxide layer, such as octamethylcyclotetrasiloxane (OMCTS). In one embodiment, not shown, the semiconductor structure includes a single hardmask layer, for example a hardmask layer including silicon nitride (SiN), in place of the first hardmask 52 and the second hardmask layer 53. The bottom block 102 also includes a first dielectric layer 54. The first dielectric layer 54 can be a low-k dielectric layer, such as a dielectric layer with a dielectric constant (k) greater than or equal to 2.2. For example, in an embodiment, the first dielectric layer 54 can include an ultra-low k (ULK) dielectric material. In another embodiment, the first dielectric layer 54 can include an organosilicon compound, such as OMCTS. The first dielectric layer can have a thickness of 80 to 200 nm. In some embodiments, the bottom block 102 includes a cap layer 56, which is a layer that can facilitate migration in the metallization layer 50. Cap layer 56 can include, for instance, SiN and can have a thickness of 10 to 30 nm. In an embodiment, as noted above, the bottom block 102 includes a metallization layer 50 included within a second dielectric layer 60. The second dielectric layer 60 can be a low-k dielectric layer, such as a dielectric layer with a dielectric constant (k) greater than or equal to 2.2. In some embodiments, the second dielectric layer 60 is composed of the same material as the first dielectric layer 54.

As is illustrated in FIG. 3A, an organic planarization layer (OPL) 106 is deposited on the spacers 104, a SiARC layer 108 is formed on the OPL 106, and a layer of photo-resist 110 is formed on the SiARC layer 108. As is shown in FIG. 3A, the photo-resist layer 110 forms an inverted mask with an inverted mask opening 111 exposing a portion of the SiARC layer 108 above some of the spacers 104. The spacers 104 can have a starting height of 50 to 150 nm.

Figure 3B:
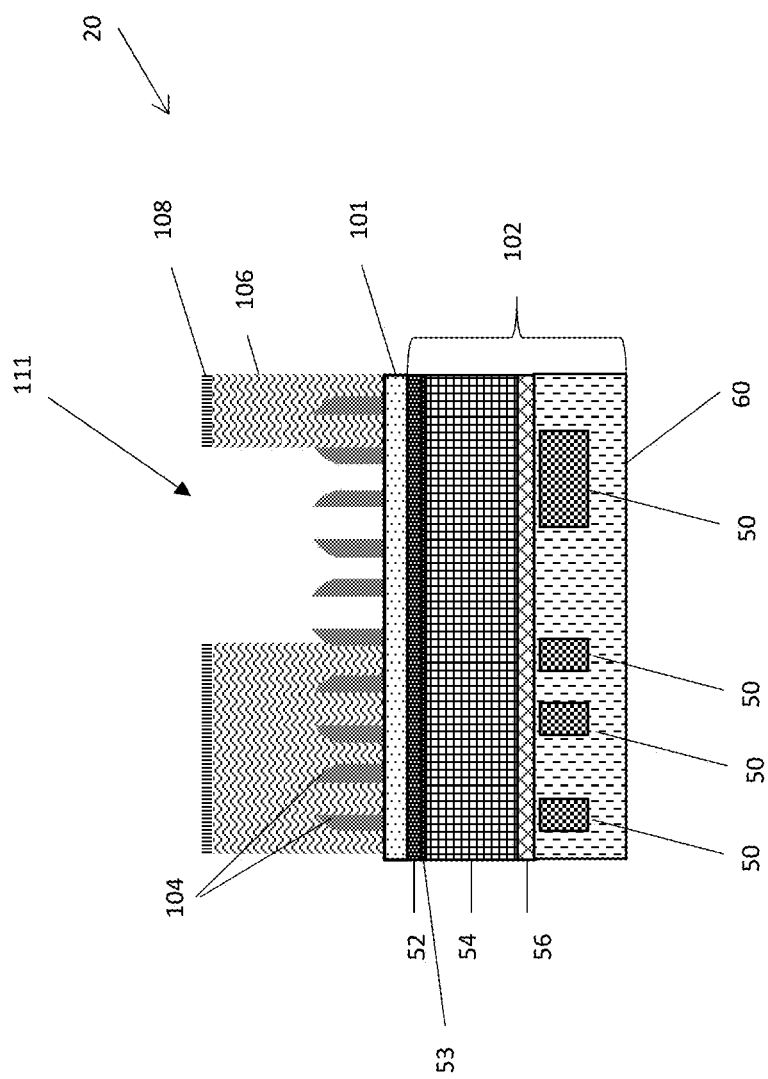

FIG. 3B illustrates the semiconductor structure 20 shown in FIG. 3A after the structure is etched to remove a portion of the SiARC layer 108 and OPL 106 in the inverted mask opening 111. The SiARC layer 108 and OPL 106 can be removed by an RIE selective to the oxide spacers 104 (does not significantly etch the spacers).

Figure 3C:
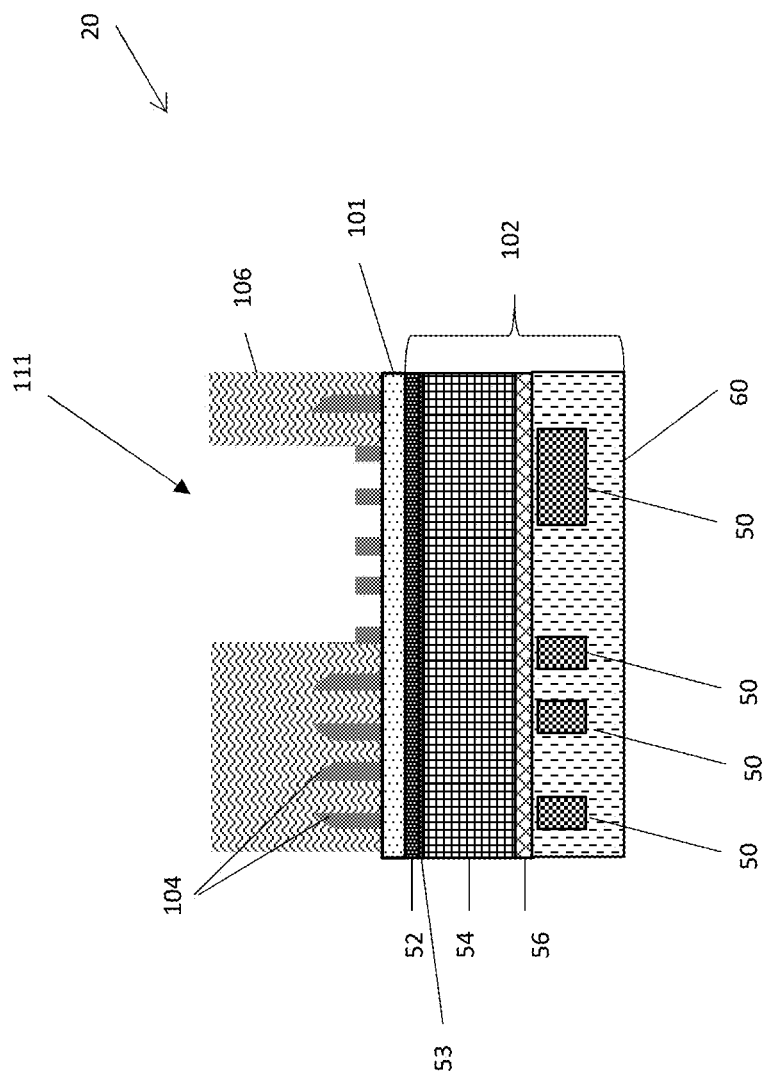

According to the exemplary method, as shown in FIG. 3C, the SiARC layer 108 is removed by RIE. In some embodiments, the spacers 104 are eroded by the RIE to reduce the spacer height of the spacers 104 in the inverted mask opening 111. In some embodiments, not shown, the spacers 104 in the inverted mask opening 111 are eliminated by RIE. For example, in some embodiments, the spacer height can be reduced by greater than or equal to 25 nm, such as by 30 nm, or by 40 nm, or by 50 nm, or by 80 nm.

Figure 3D:
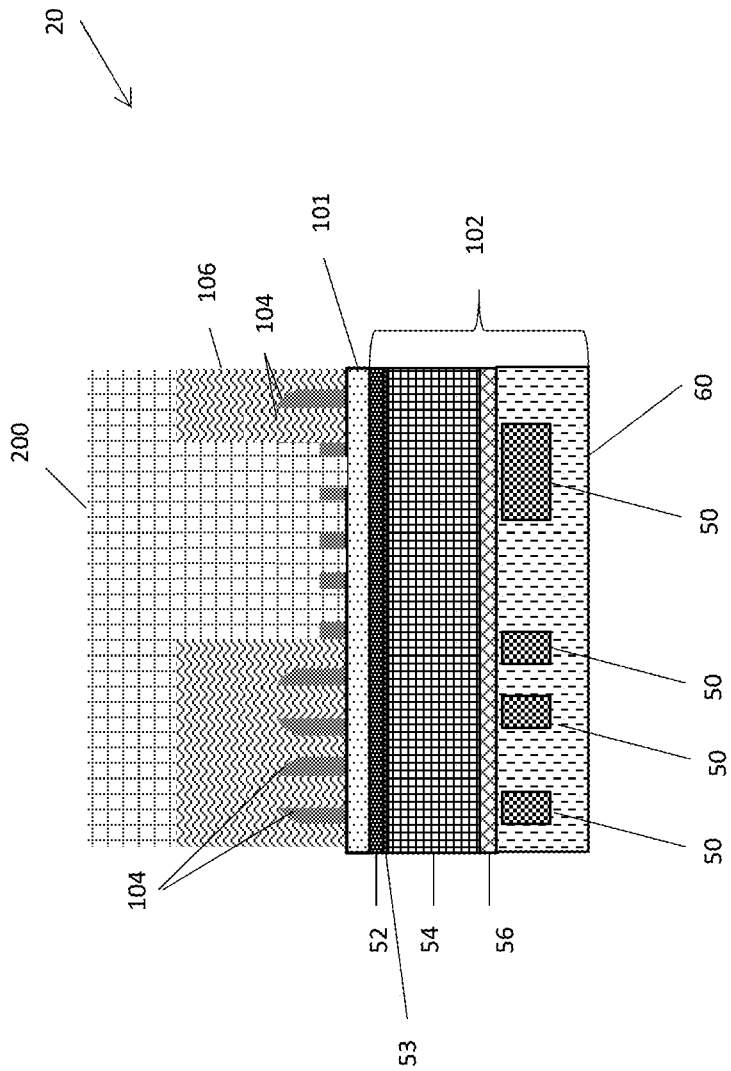

As is shown in FIG. 3D, the exemplary method can include depositing a fill material 200 on the semiconductor structure 20. The fill material 200 can include any material that has filling properties suitable for semiconductor applications, that has a desired selectivity over an organic RIE, and that has a desired selectivity against a TiN RIE. For example, in some embodiments, the fill material 200 has a selectivity ratio of OPL to fill material of 1:4. In some embodiments, the fill material 200 has a selectivity ratio of metal hardmask layer 101 to fill material 200 of 1:20, for instance a ratio of TiN to fill material of 1:20. For example, and not by limitation, the fill material 200 can include a silicon containing organic material, such as silicon tetrahydride (SiTH), a bottom anti-reflective coating (BARC) material, such as a light absorbing oxide material (DUO), an OPL material, such as amorphous carbon (a-C), amorphous silicon (a-Si), or other similar materials.

Figure 3E:
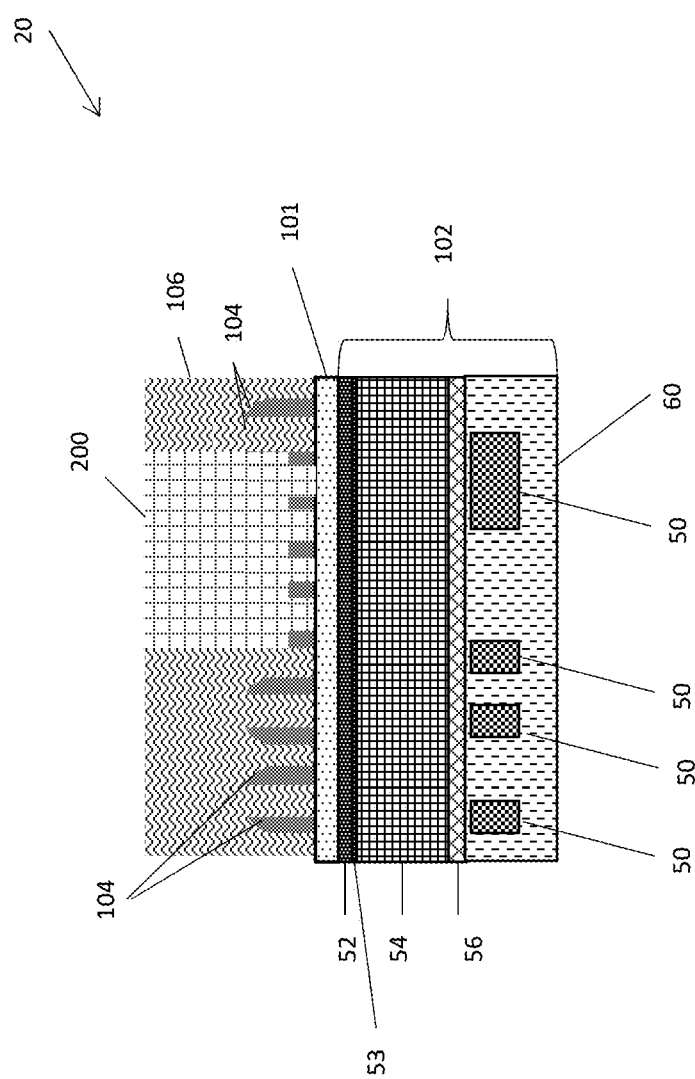

As is shown in FIG. 3E, according to an embodiment the fill material 200 can be removed to the top of the OPL 106, for example by chemical mechanical planarization (CMP) or by RIE.

Figure 3F:
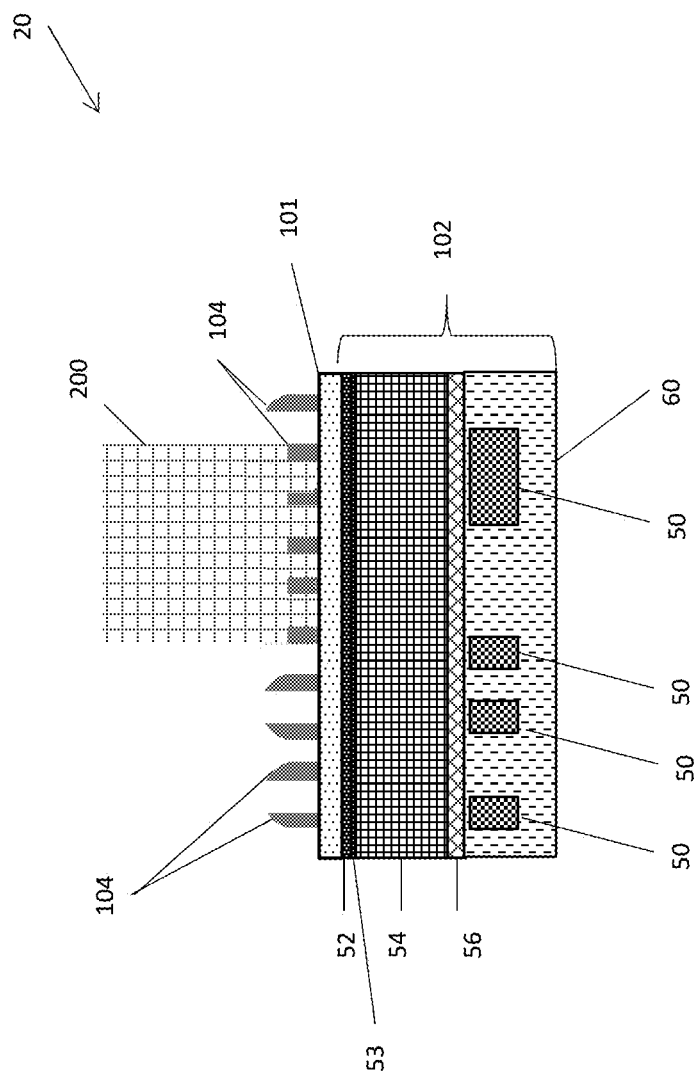

As is shown in FIG. 3F, according to an embodiment, the OPL 106 can be removed from the semiconductor structure 20, exposing some of the spacers 104.

Figure 3G:
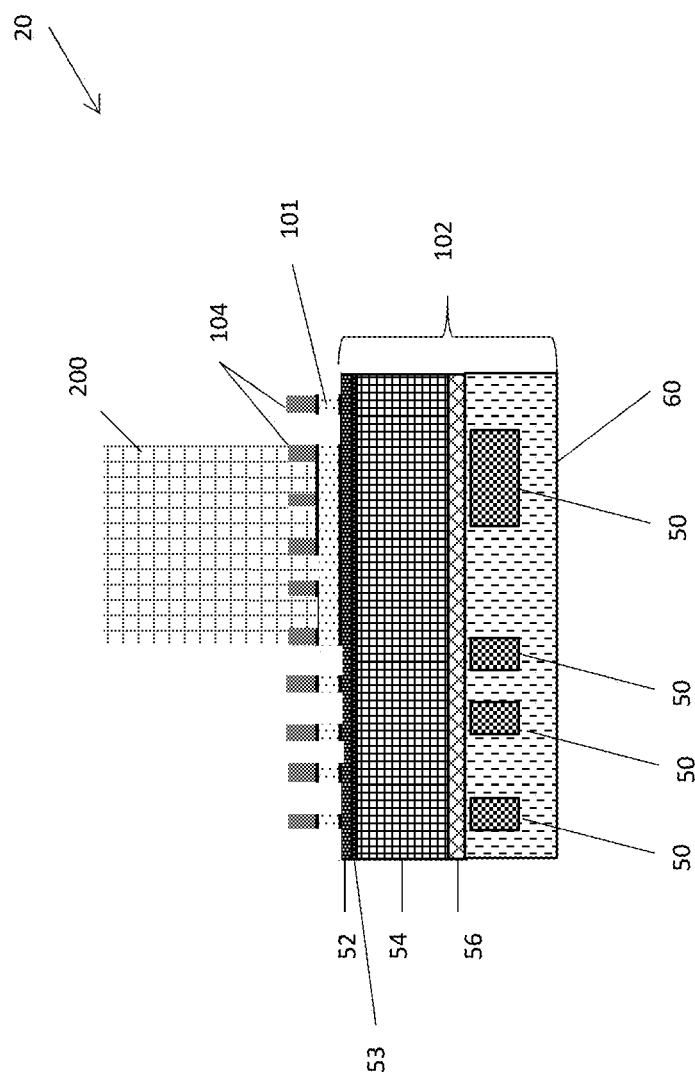

As is shown in FIG. 3G, according to an embodiment, the metal hardmask layer 101 is etched in the exposed regions to define a pattern. In some embodiments, spacers 104 can be eroded during etching of the metal hardmask layer 101.

Figure 3H:
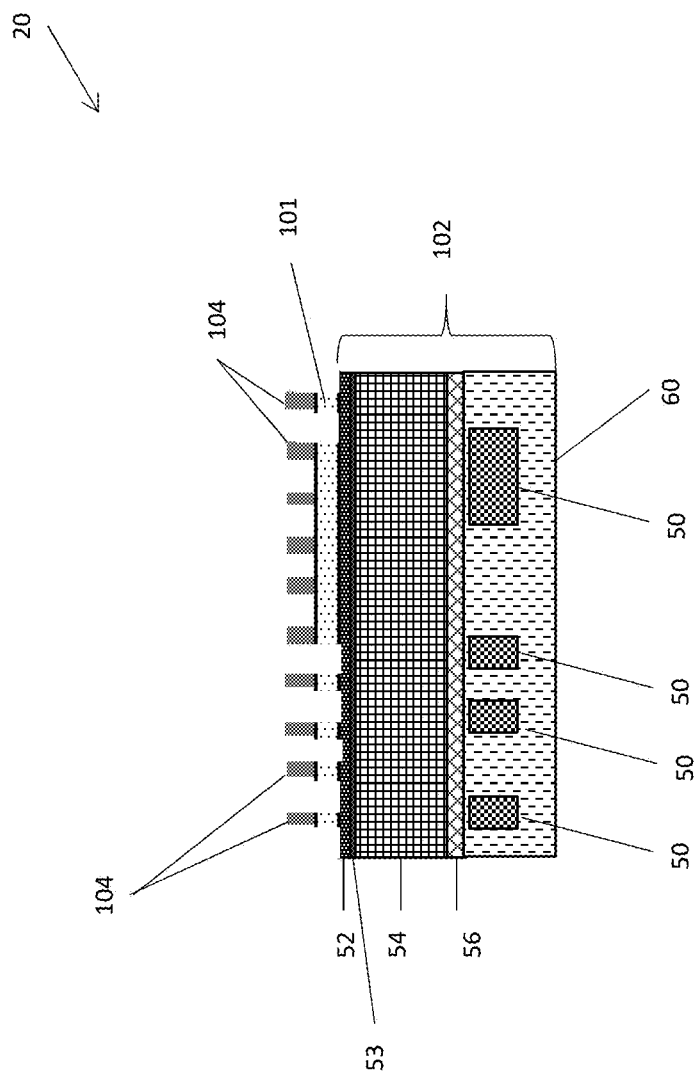
FIG. 3H is a cross-sectional view of the exemplary semiconductor structure after removing the fill material.

Then, as shown in FIG. 3H, the fill material 200 shown in FIG. 3G can be removed from the structure 20.

Figure 4A:
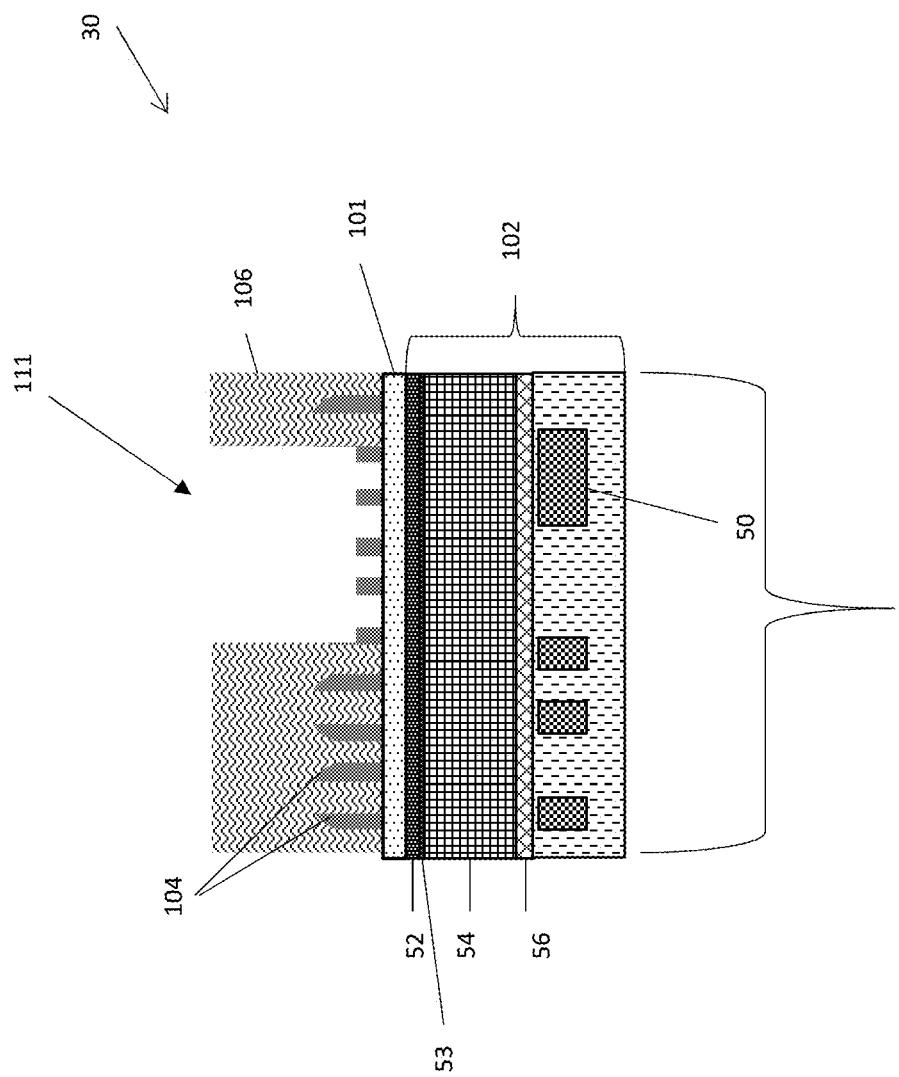
Figure 4B:
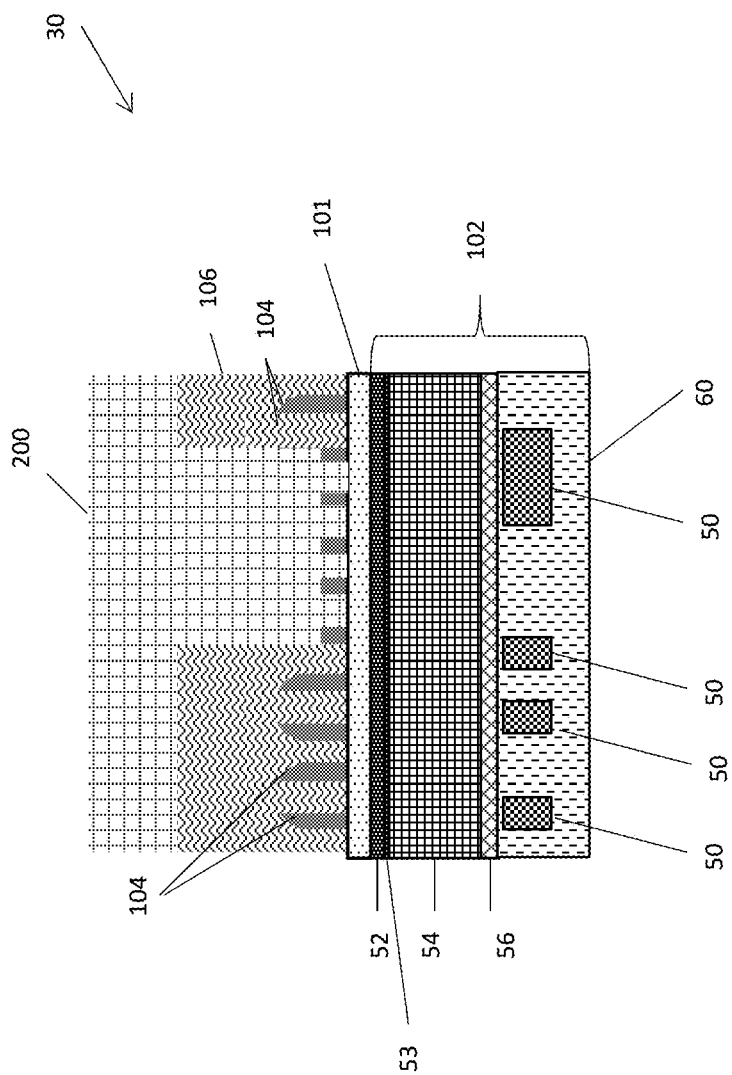
Figure 4C:
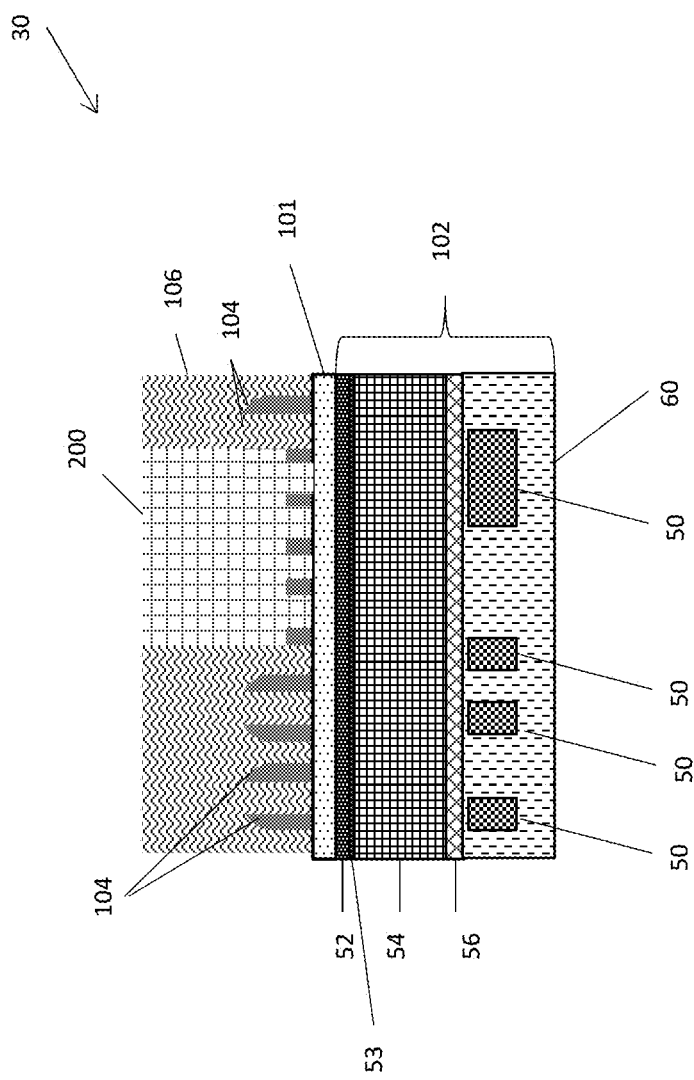

FIGS. 4A-4F illustrate an exemplary method of making a semiconductor with improved spacer height according to another embodiment. FIG. 4A is a cross-sectional view of an exemplary semiconductor structure 30 after creating an inverted mask opening 111 and eroding spacers 104 in the inverted mask opening 111 in a first semiconductor block stack 400, for example by methods illustrated in FIGS. 3A-3C. As shown in FIG. 4B, a fill material 200 can be deposited on the semiconductor structure 300. Then, as shown in FIG. 4C, in some embodiments the fill material 200 can be removed to the top of an OPL 106, for instance by RIE or CMP.

Figure 4D:
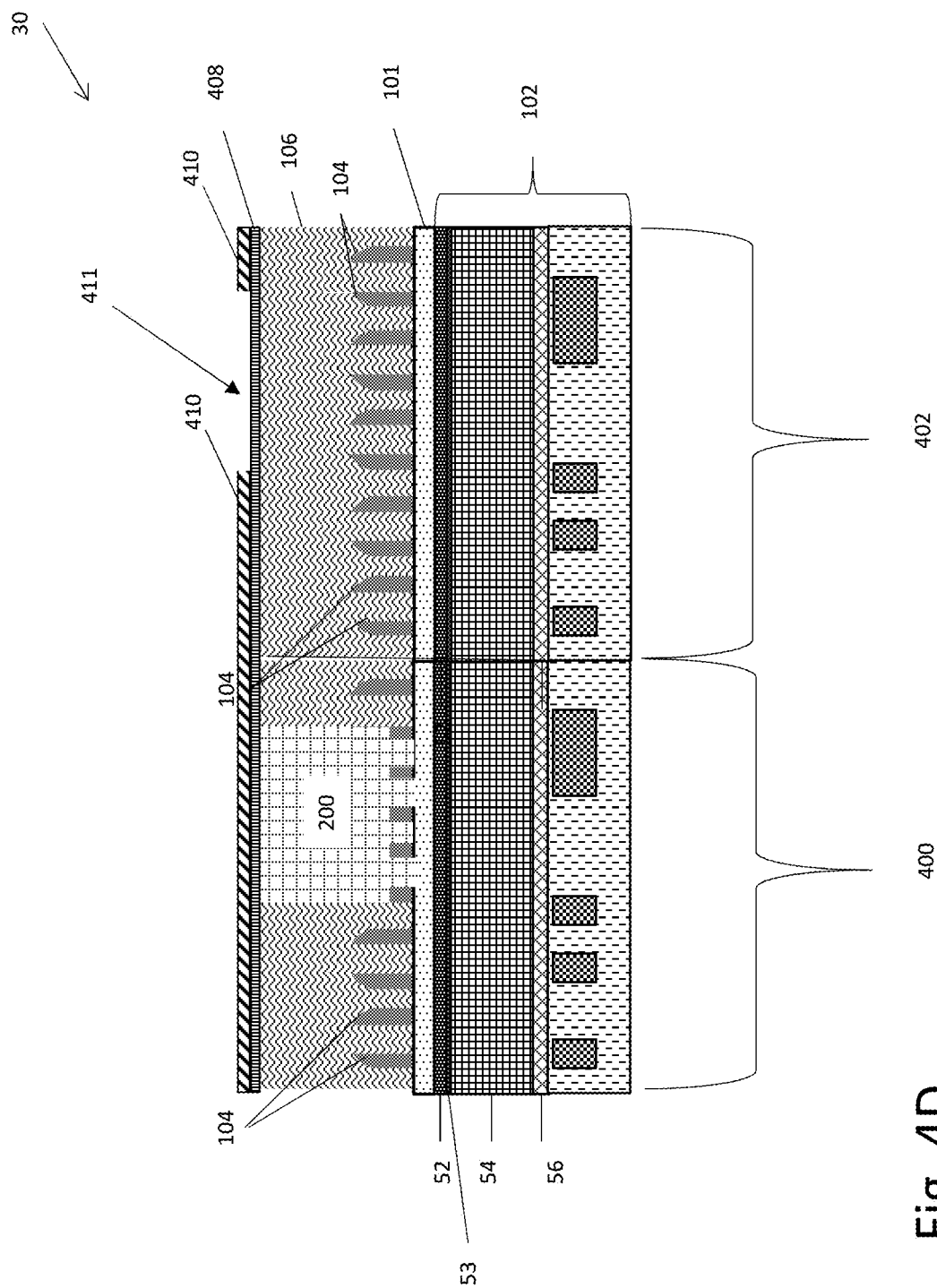

FIG. 4D is a cross-sectional view of the exemplary semiconductor structure after defining a second block stack 402. The second block stack includes an OPL 106 and a plurality of spacers 104 atop a metal hardmask layer 101. The spacers 104 can have a starting height of 50 to 150 nm. The second block stack also can include a bottom semiconductor block 102. As is illustrated, in an embodiment, a second SiARC layer 408 can be formed on the semiconductor structure 30 and a second layer of photo-resist 410 is formed on the second SiARC layer. As is shown in FIG. 4D, the photo-resist layer 410 forms a second inverted mask with a second inverted mask opening 411 exposing a portion of the second SiARC layer 408 of the second block stack 402.

As is illustrated in FIG. 4E, in a method according to an embodiment the semiconductor structure formed in FIG. 4D can be etched with RIE to remove the a portion of the second SiARC layer 408 and OPL 106 in the second inverted mask opening 411. The second SiARC layer 408 and OPL 106 can be removed by an RIE selective to the oxide spacers 104. Then, in some embodiments, the spacers 104 in the second inverted mask opening 411 are eroded by RIE to reduce the height of the spacers 104.

Figure 4F:
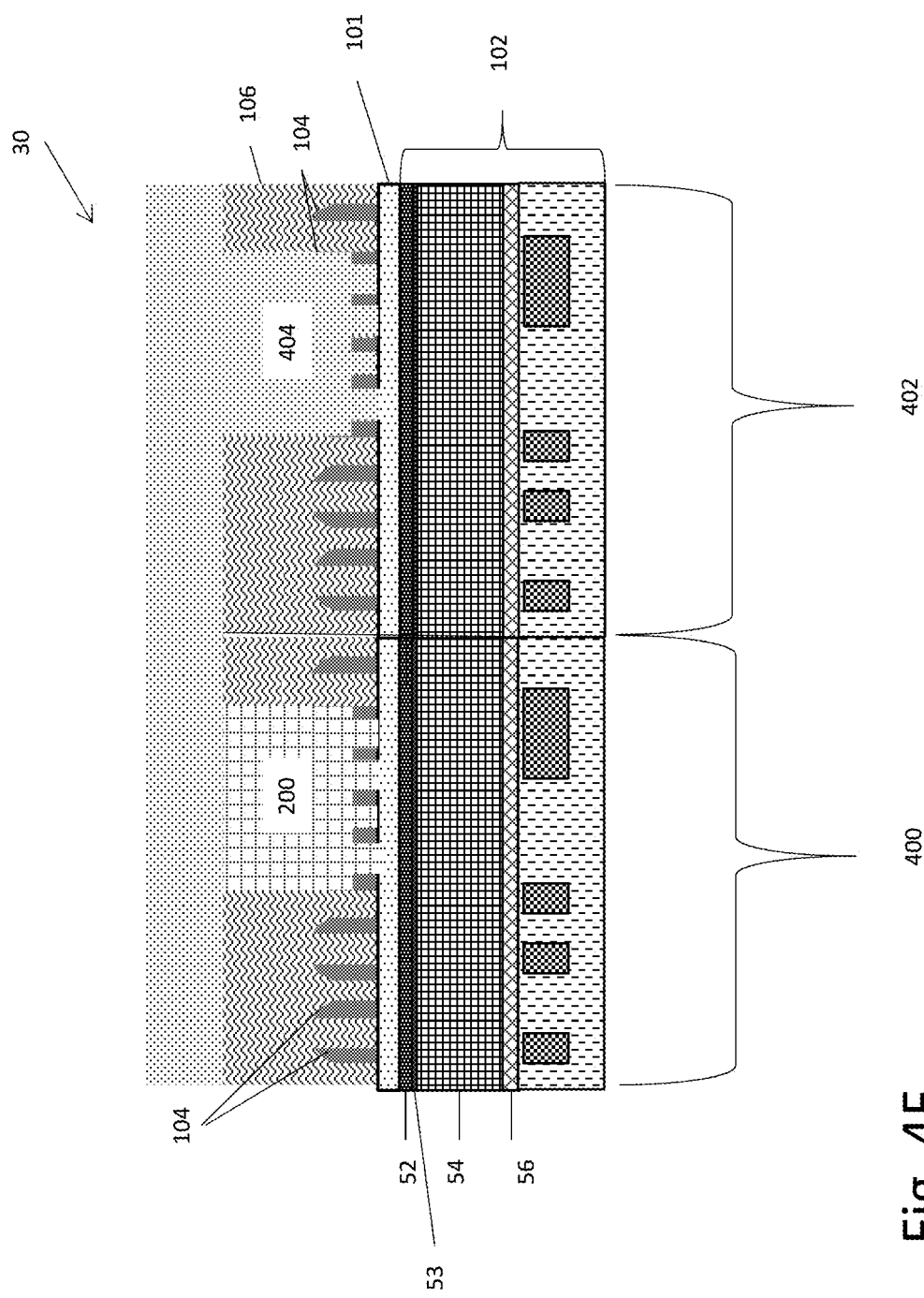

The exemplary method includes, as illustrated in FIG. 4F, depositing a second fill material 404. The second fill material 404 can include any material that has filling properties suitable for semiconductor applications, that has a desired selectivity over an organic RIE, and that has a desired selectivity against a TiN RIE. Preferably, the second fill material 400 has the properties described herein with respect to the first fill material 200. In some embodiments, the second fill material 404 can be the same material as the first fill material 200. In some embodiments, the second fill material 404 is a different material from the first fill material 200.

Figure 4G:
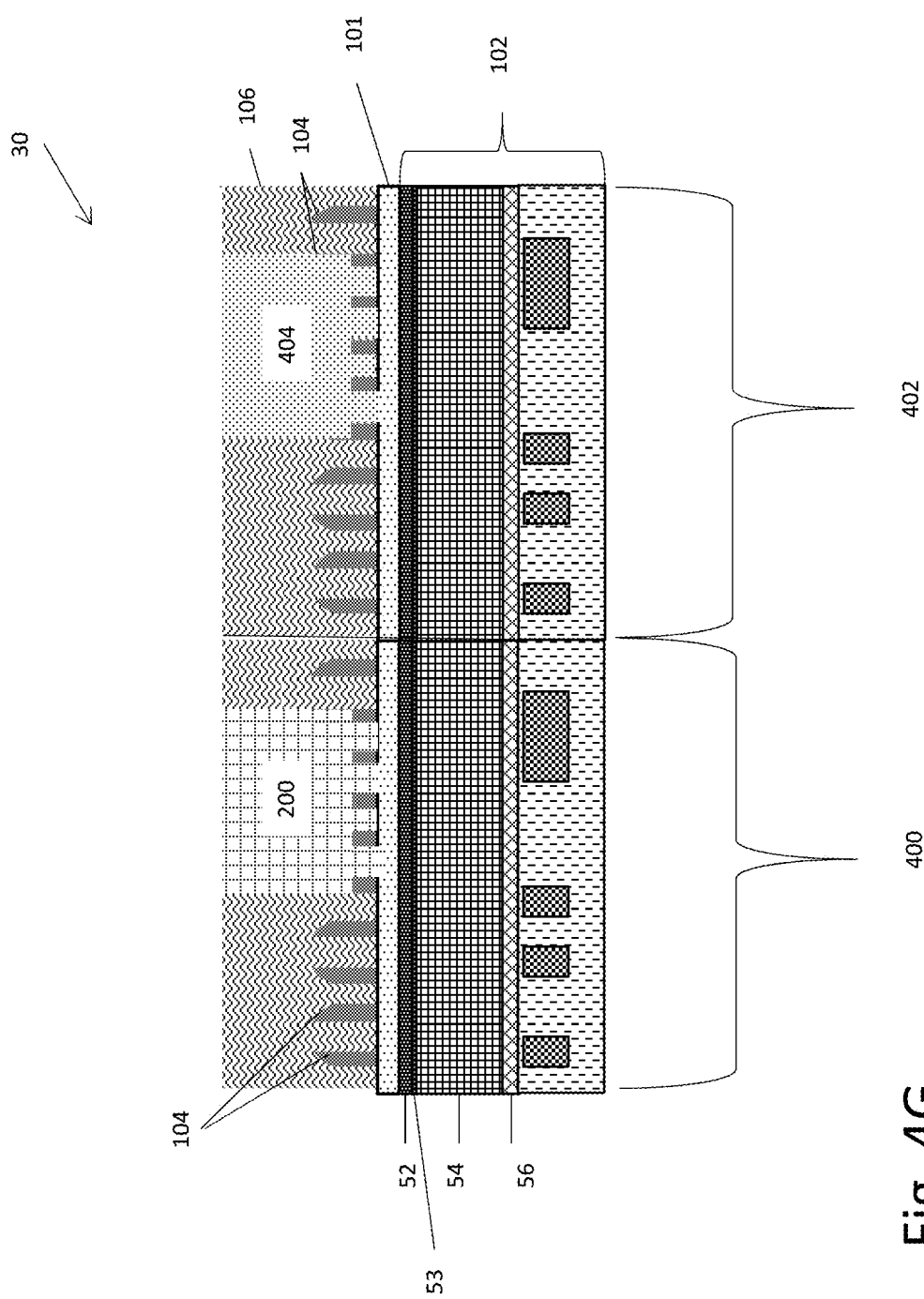
FIG. 4G is a cross-sectional view of the exemplary semiconductor structure after removing the second fill material to the top of the organic planarization layer.

In some embodiments, as is illustrated in FIG. 4G, the second fill material 404 can be removed to the top of the OPL 106.

In some embodiments, methods include adding one or more additional block stacks as is described herein with respect to the second block stack. For example, in some embodiments, methods include forming a third block stack including a third inverted block opening with a third fill material.

FIGS. 5A-5K illustrate another exemplary method of making a semiconductor having improved spacer height according to one or more embodiments. The exemplary method can include using a block memorization layer.

FIG. 5A illustrates a cross-sectional view of the exemplary semiconductor 40 including a first mask 510 on a multi-layer structure. The multilayer structure includes a plurality of spacers 104 atop a metal hardmask layer 101.

The spacers 104 can have a starting height of 50 to 150 nm. Metal hardmask layer 101 can include, for example, TiN and can have a thickness of 10 to 30 nm. In some embodiments, metal hardmask layer is positioned above a first hardmask 52 and second hardmask 53. In some embodiments, not shown, a single hardmask layer can be used in place of first hardmask 52 and second hardmask. The single hardmask layer in some embodiments is a SiN layer. A bottom block 500 can be included below the first hardmask 52. Bottom block 500 can include a dielectric layer, such as a low-k dielectric layer having a dielectric constant greater than or equal to 2.2. For example, in some embodiments, the bottom block 500 can include the material of the first dielectric layer 54 described herein. The bottom block 500 can have a thickness of 80 to 200 nm. In some embodiments, OPL 106 is deposited on the spacers 104 and a top TiN layer 502 is deposited on the OPL 106. The OPL 106 can have a thickness of 1000 to 2000 nm in some embodiments. Top TiN layer 502 can include, for instance, TiN having a thickness of 10 to 30 nm. In the exemplary method, an LTO mask 504 is formed on the top TiN layer 502 and a top OPL 506 is deposited on the LTO mask 504. The top OPL can have a thickness of 1000 to 2000 nm in some embodiments. A top SiARC layer 508 is formed on the top OPL 506 and a first mask 510 including a layer of photo-resist is patterned on the top SiARC layer 508 to generate a first unmasked region 511. The top SiARC layer 508 can have a thickness of 10 to 35 nm in some embodiments. The LTO mask can have a thickness, in some embodiments, of 10 to 30 nm.

Figure 5B:
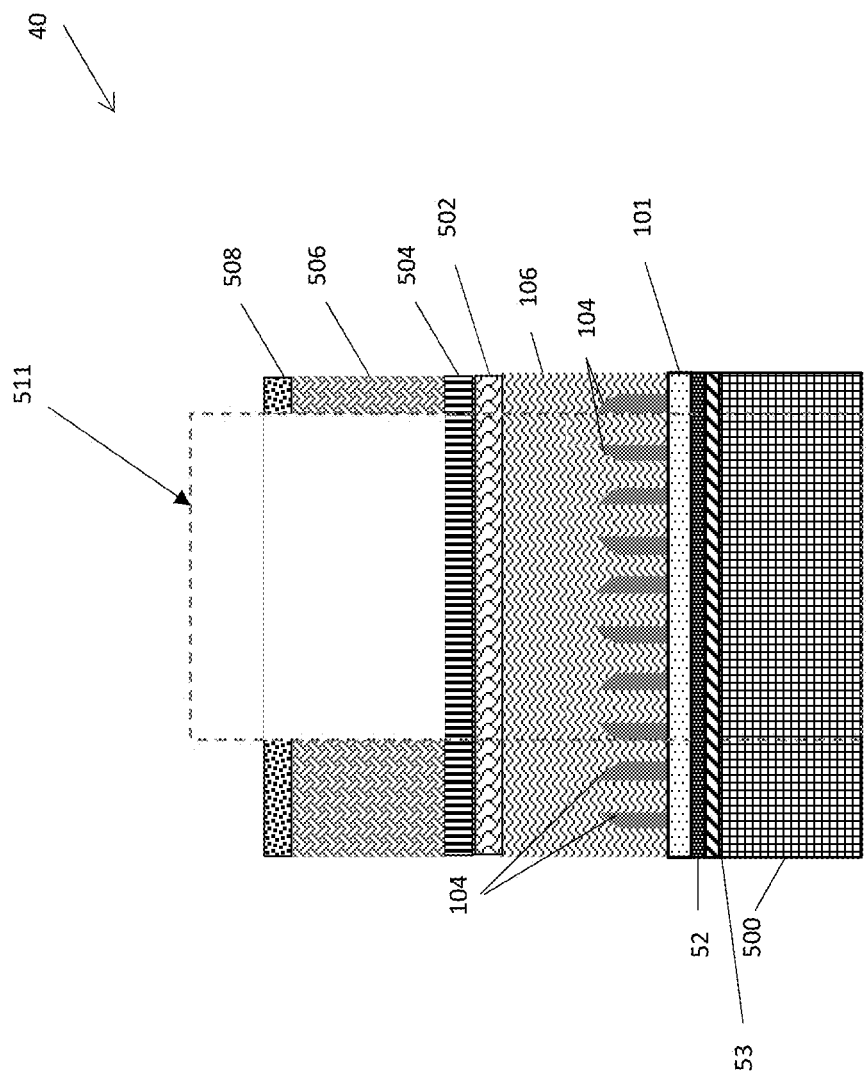

FIG. 5B illustrates a cross-sectional view of the exemplary semiconductor structure after removing the top SiARC layer 508 and top OPL 506 of FIG. 5A in the first unmasked region 511. The semiconductor structure 40 can be opened to the LTO mask 504 in the first unmasked region 511 in an embodiment with SiARC RIE and OPL RIE. In an embodiment, the first mask is removed from the structure 40.

Figure 5C:
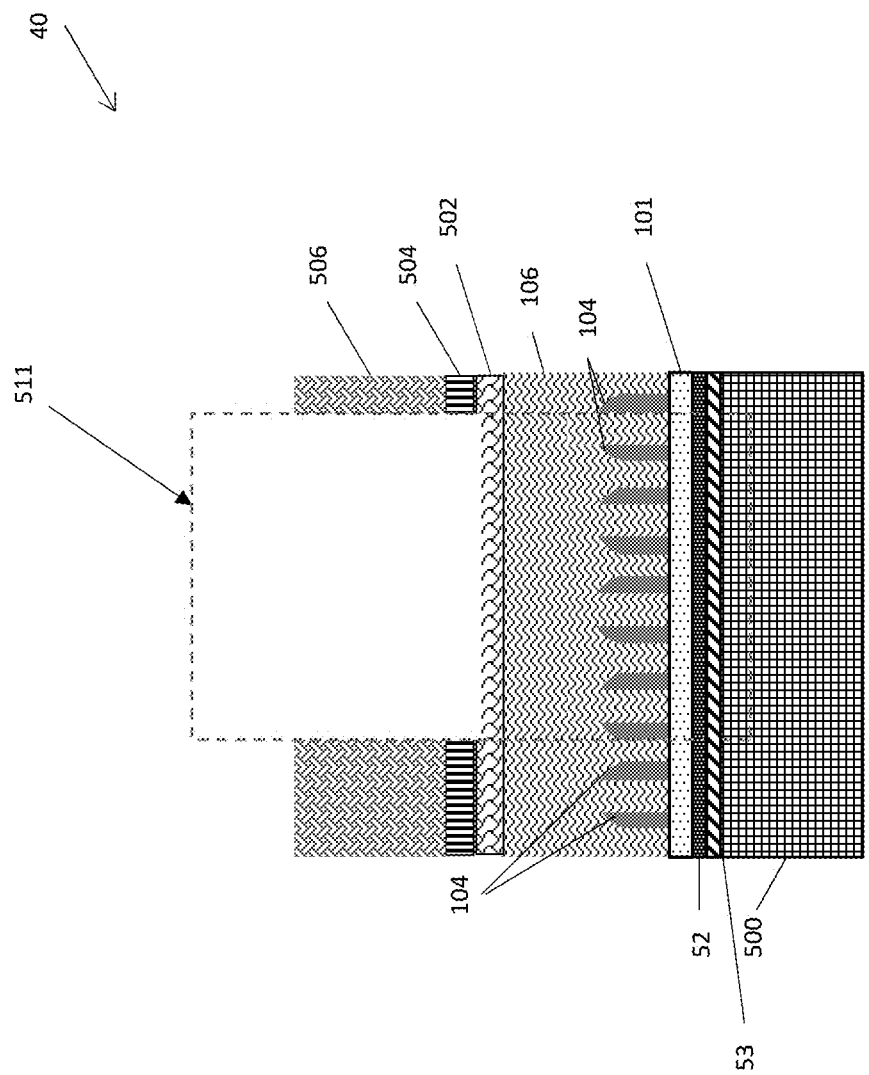

In some embodiments, the exposed SiARC, including the top SiARC layer 508 and the LTO mask 504 in the first unmasked region 511, is removed. FIG. 5C illustrates a cross-sectional view of the exemplary semiconductor structure 40 after removing the top SiARC 508 and the LTO mask 504 in the first unmasked region 511.

Figure 5D:
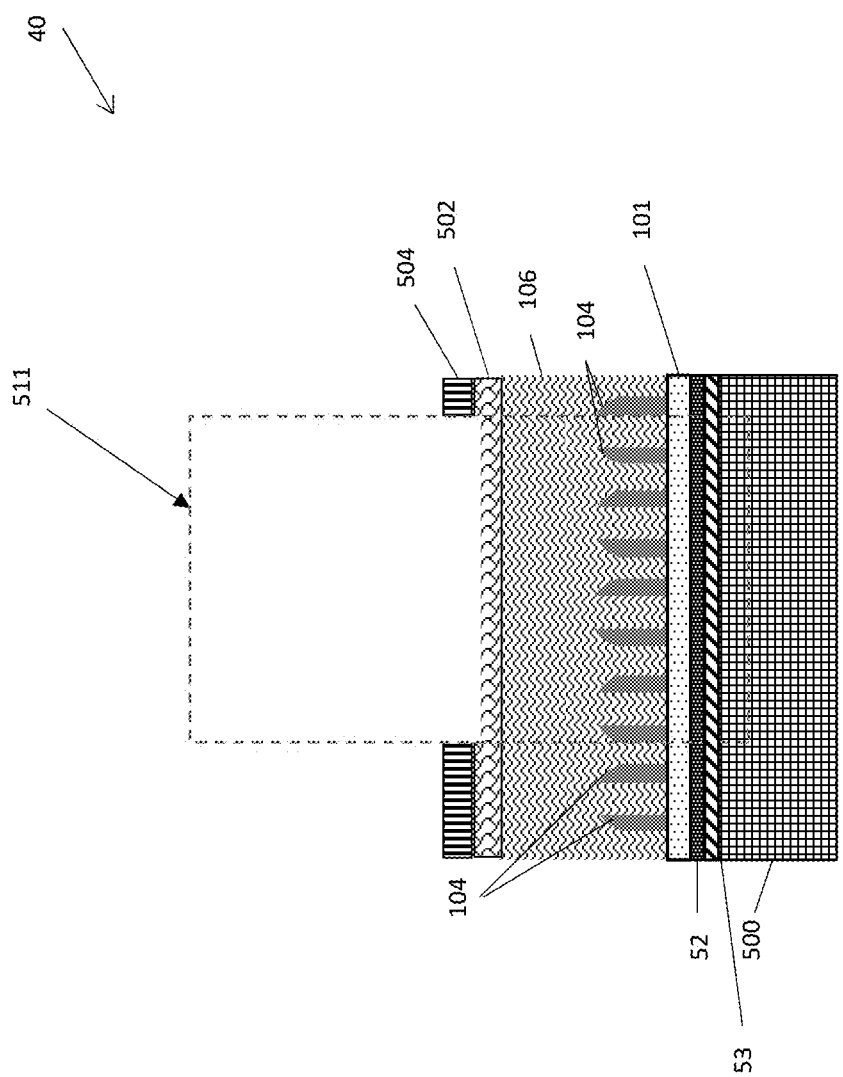

Next, in some embodiments, the top OPL 506 is removed from the structure 40. FIG. 5D illustrates a cross-sectional view of the exemplary semiconductor structure after removing the top OPL from the structure 40.

In some embodiments, wet etch is not used in any of the exemplary method steps illustrated in FIGS. 5A-5D.

Figure 5E:
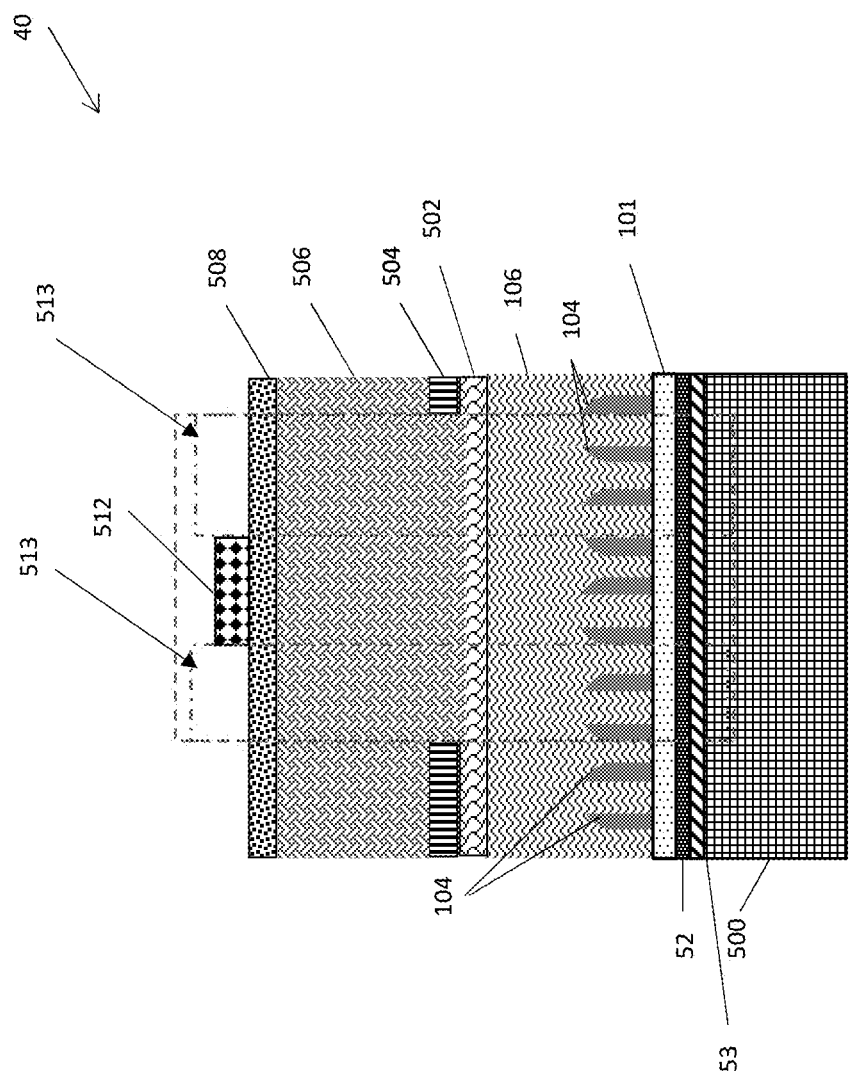

FIG. 5E illustrates a cross-sectional view of the exemplary semiconductor structure after adding a top OPL 506, top SiARC layer 508, and second mask 512. Top OPL 506 and top SiARC layer 508 are layers as previously described. The second mask 512 can be the same material or a different material than the first mask described herein. After depositing a second mask 512, a second unmasked region 513 is defined. The second unmasked region 513 includes regions that are both unmasked by the first mask and by the second mask 512.

Figure 5F:
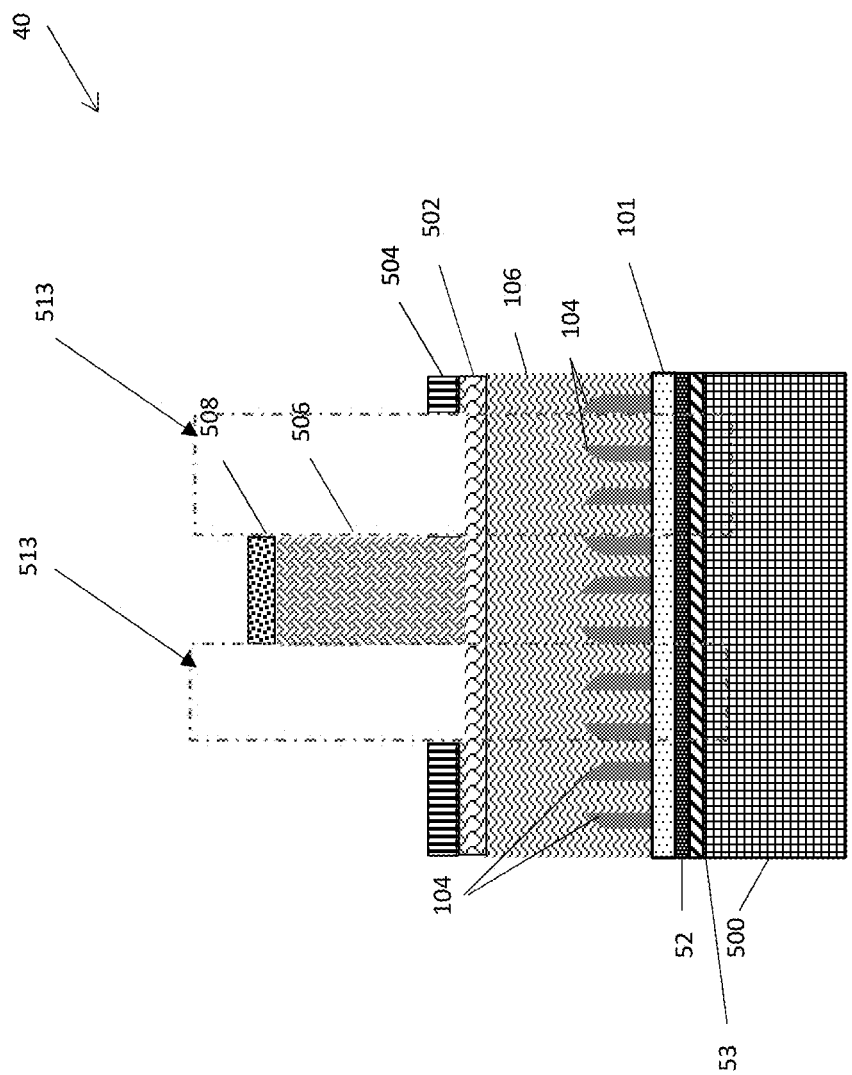

FIG. 5F illustrates a cross-sectional view of the exemplary semiconductor structure after removing the top SiARC 508 and top organic planarization layer 506 in regions exposed by the second mask 508. In some embodiments, the top SiARC 508 is removed by SiARC RIE, removing the top SiARC 508 from the structure 40. The top OPL 506 can be removed to the LTO mask, where present, or to the top TiN layer 502. In some embodiments, the top OPL 506 is removed by OPL RIE. The second mask 512 can be removed.

Figure 5G:
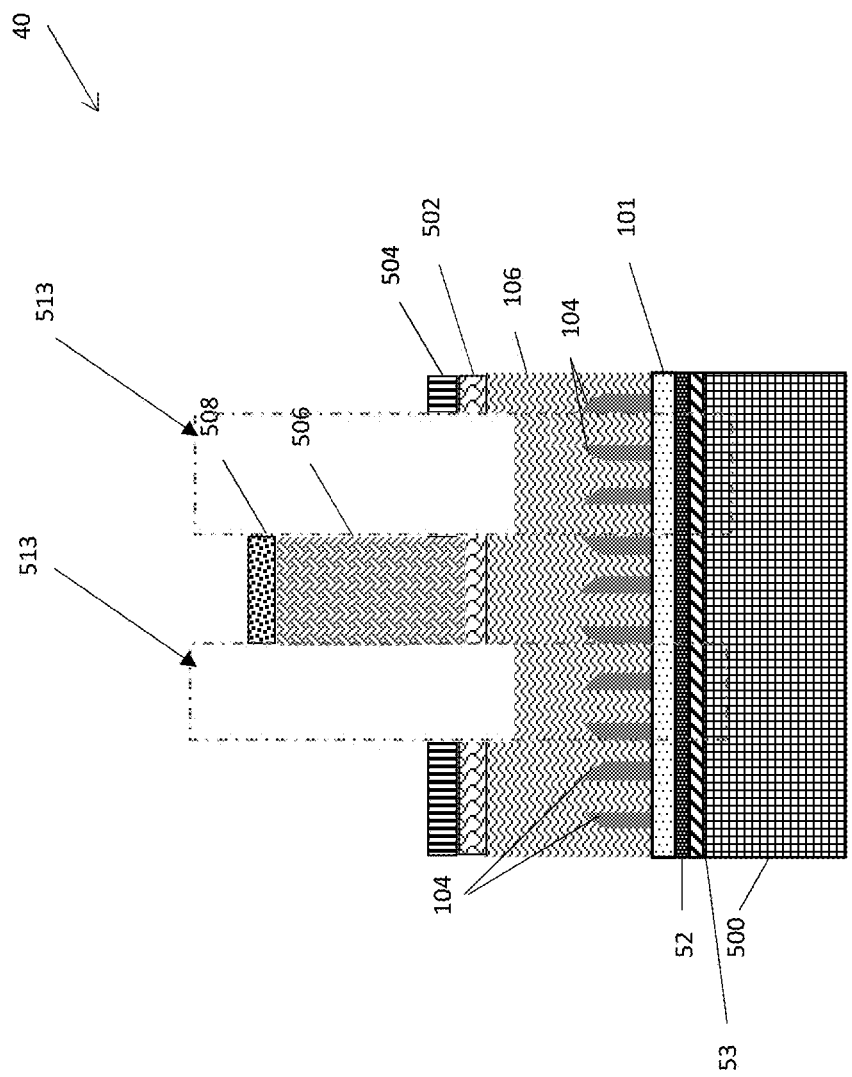

FIG. 5G illustrates a cross-sectional view of the exemplary semiconductor structure 40 after removing a portion of the top TiN layer 502. For example, the top TiN layer 502 can be removed in the second unmasked region 513, as shown. In some embodiments, the top TiN layer 502 is removed by TiN etching. In some embodiments, short oxide breakthrough (BT) etching is performed.

Figure 5H:
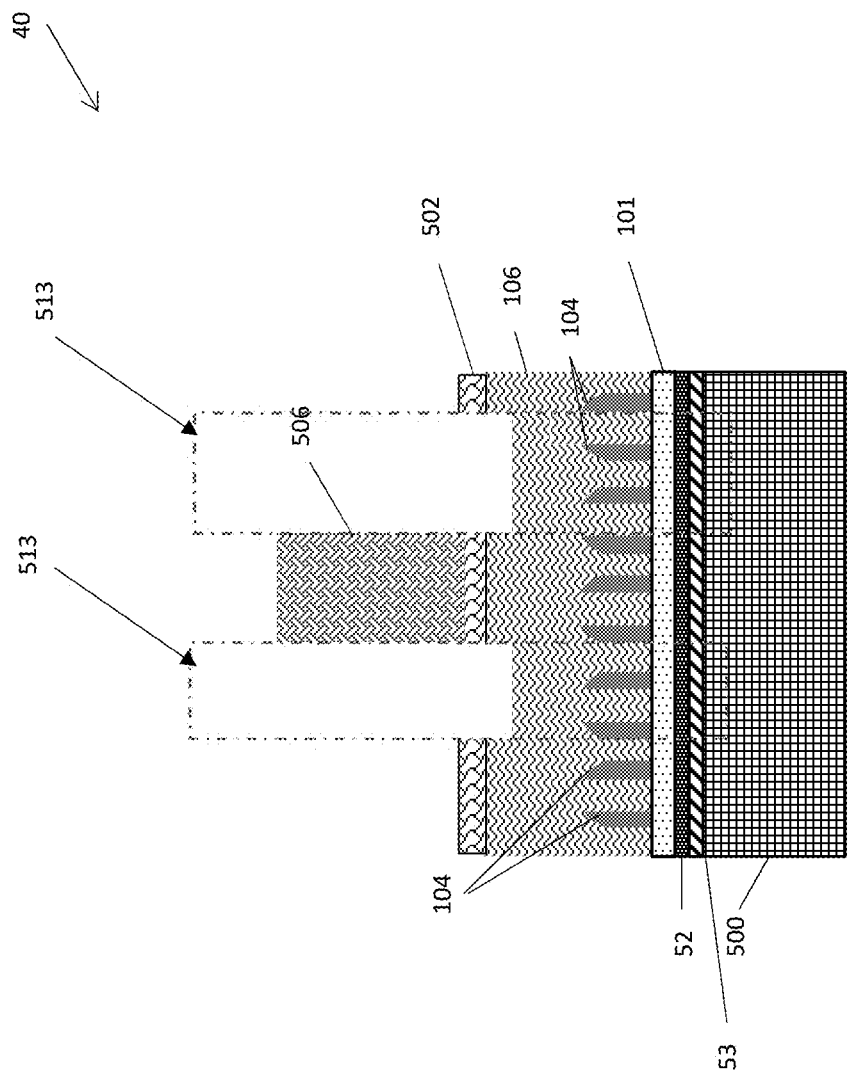
Figure 51:
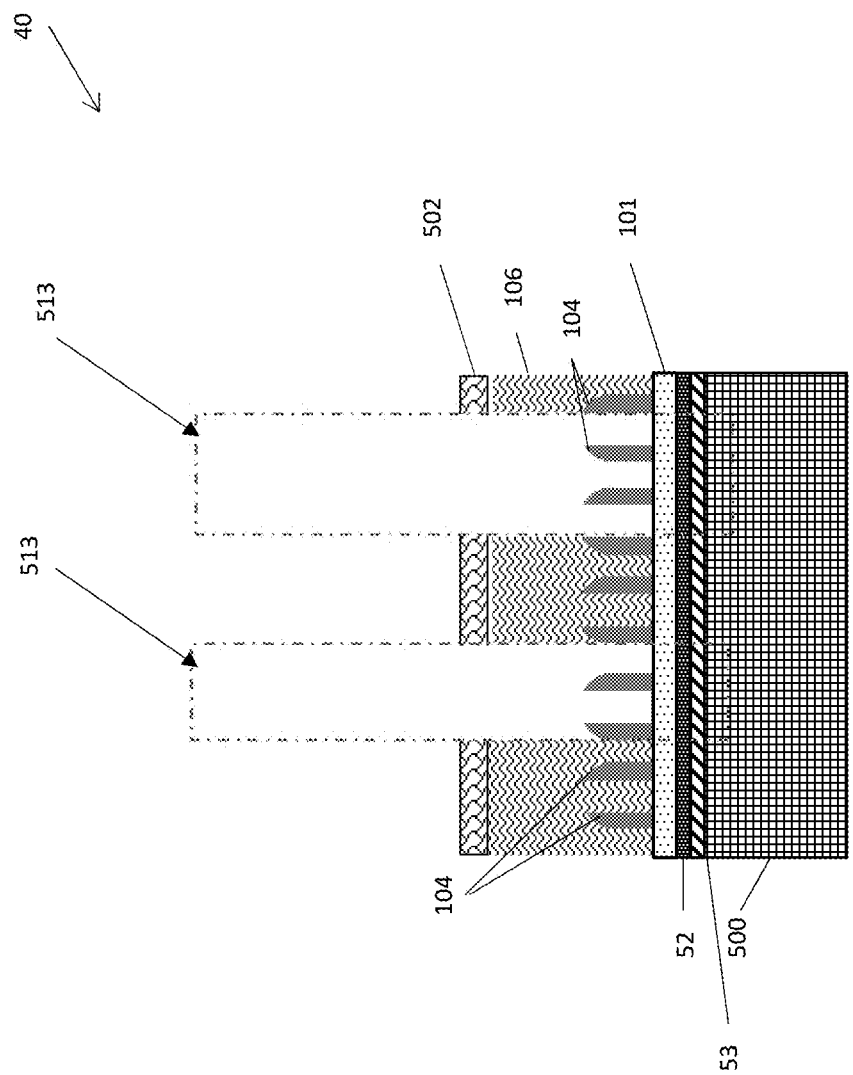

FIG. 5H a cross-sectional view of the exemplary semiconductor structure 40 after removing the top SiARC and LTO mask in the second unmasked region 513.

FIG. 5I illustrates a cross-sectional view of the exemplary semiconductor structure 40 after removing the top OPL and a portion of the OPL 106 in the second unmasked region 513, for example by OPL RIE.

Figure 5J:
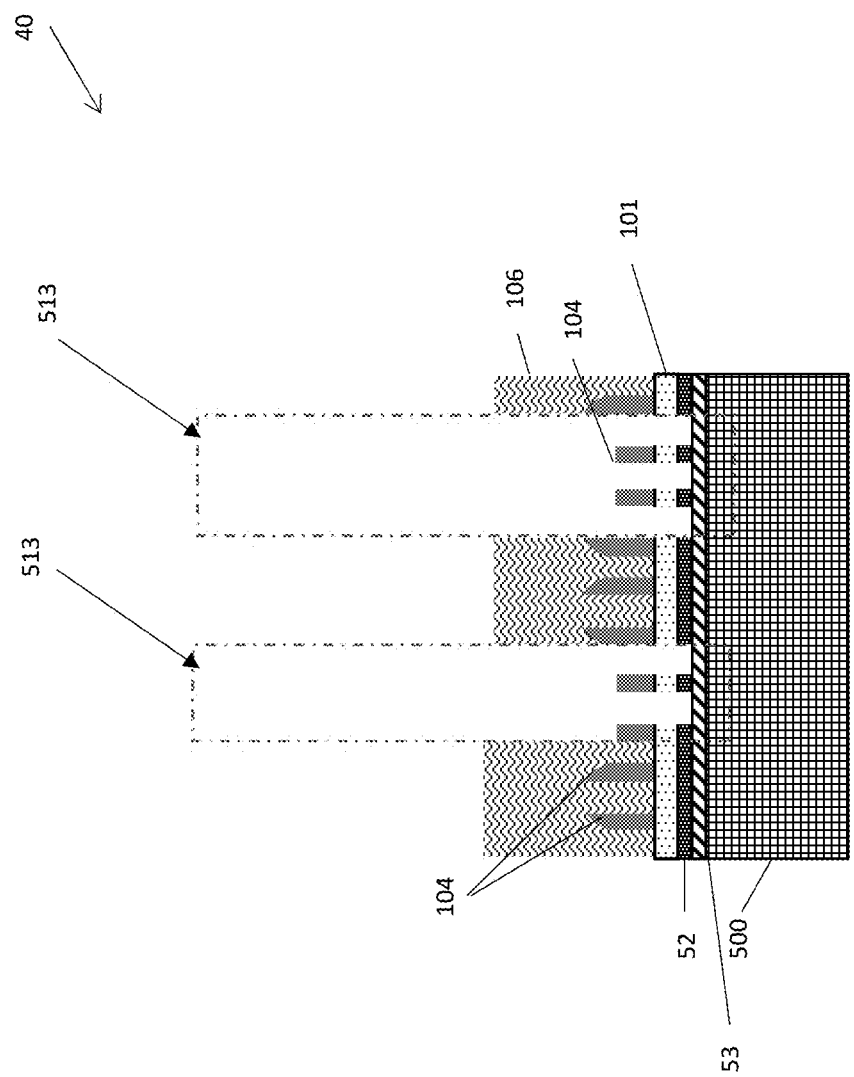

FIG. 5J illustrates a cross-sectional view of the exemplary semiconductor structure 40 after removing the top TiN layer and a portion of the bottom metal hardmask layer 101, which can be a TiN layer, in the regions between the spacers 104. The bottom metal hardmask layer 101 can have a thickness of 10 to 30 nm. The height of spacers 104 in the second unmasked region can be reduced. In some embodiments, not shown, the spacer width can be reduced in the unmasked region. In some embodiments, the semiconductor structure 40 can be etched to form one or more openings to the first 52 or second hardmask 53 or to the bottom block 500.

Figure 5K:
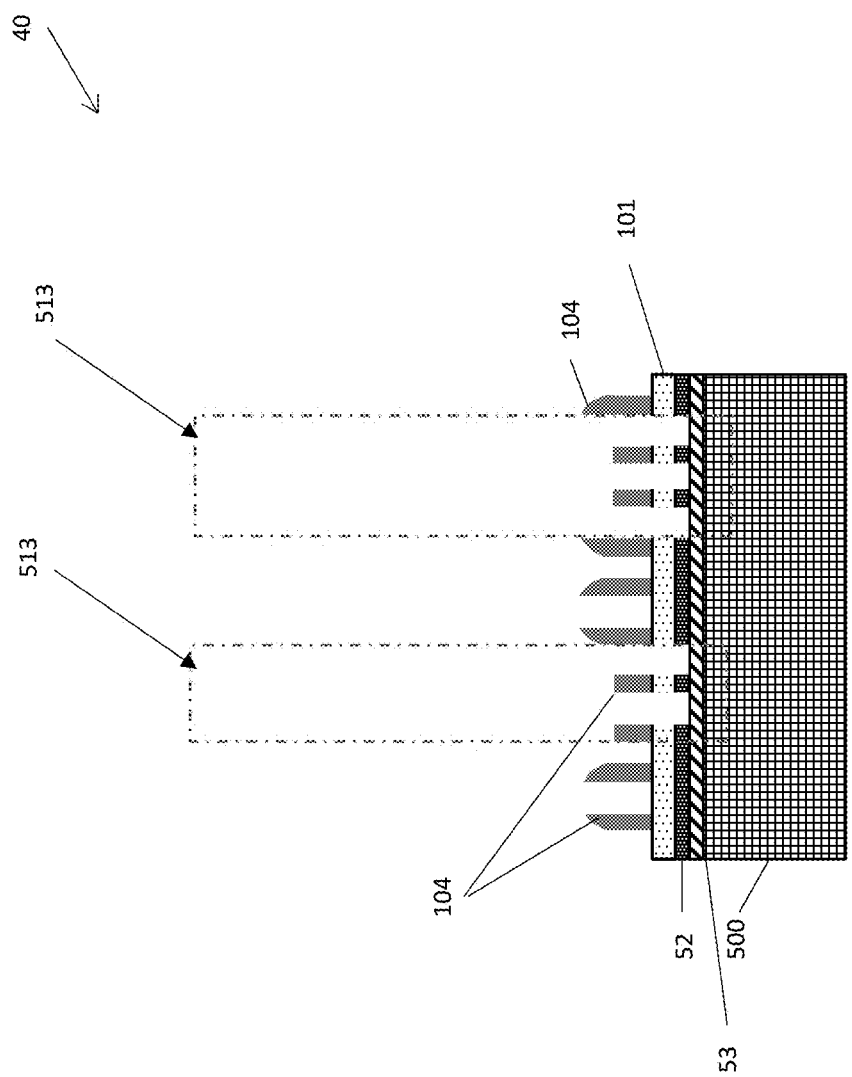

FIG. 5K illustrates a cross-sectional view of the exemplary semiconductor structure 40 after removing the OPL from the structure 40. The OPL can be removed by wet or dry etch. In some embodiments, the structure 40 is further processed to form vias.

In some embodiments, for instance at the end of the exemplary method illustrated in FIGS. 5A-5K, the difference in spacer height is improved. In some embodiments, no wet SiARC is needed. The exemplary method can be used for single block patterning or multi-block patterning.

Deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography, nanoimprint lithography, and reactive ion etching.

The etching process may include a dry etch (e.g., reactive ion etching, plasma etching, ion beam etching, or laser ablation). The etching process may alternatively include a wet chemical etch (e.g., with potassium hydroxide, or sulfuric acid and hydrogen peroxide). In some exemplary embodiments, both dry etching and wet chemical etching processes may be used. After transferring the pattern, the patterned photoresist is removed utilizing resist stripping processes, for example, ashing. Ashing may be used to remove a photoresist material, amorphous carbon, or organic planarization (OPL) layer. Ashing is performed using a suitable reaction gas, for example, $O_2$, $N_2$, $H2/N2$, $O_3$, $CF_4$, or any combination thereof.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making a semiconductor structure comprising:
    providing a semiconductor structure comprising a plurality of spacers on top of a TiN layer, an organic planarization layer on top of the plurality of spacers, and a SiARC layer on top of the organic planarization layer;
    forming an inverted mask on the semiconductor structure, the inverted mask comprising an inverted mask opening above a portion of the plurality of spacers and a portion of the TiN layer;
    eroding the portion of the plurality of spacers below the inverted mask opening;
    depositing a fill material masking the portion of the plurality of spacers below the inverted mask opening and the portion of the TiN layer below the inverted mask opening to generate a masked TiN layer segment and an unmasked TiN layer segment, the masked TiN layer segment being below the inverted mask opening and the unmasked TiN layer segment not being below the inverted mask opening; and
    removing a portion of the unmasked TiN layer segment.

2. The method of claim 1, further comprising after forming an inverted mask on the semiconductor structure, removing the SiARC layer in the inverted mask opening and removing the organic planarizing layer in the inverted mask opening.

3. The method of claim 2, wherein removing the SiARC layer or removing the organic planarizing layer comprises performing RIE.

4. The method of claim 1, wherein eroding the portion of the plurality of spacers below the inverted mask opening comprises etching the spacers with RIE.

5. The method of claim 1, comprising removing the plurality of spacers below the inverted mask opening.

6. The method of claim 1, wherein the fill material has an etch selectivity ratio for the organic planarization layer to fill material of 1:4 in an organic RIE.

7. The method of claim 1, wherein the fill material has an etch selectivity for TiN to fill material of 1:20 in a TiN RIE.

8. The method of claim 1, wherein the fill material comprises SiTH.

9. A method of making a semiconductor structure comprising:
    providing a first semiconductor block stack comprising a first plurality of spacers on top of a first TiN layer, a first organic planarization layer on top of the first plurality of spacers, and a first SiARC layer on top of the organic planarization layer;
    forming a first inverted mask on the first semiconductor block stack, the first inverted mask comprising a first inverted mask opening,
    eroding the portion of the plurality of spacers below the first inverted mask opening;
    depositing a first fill material masking the portion of the first plurality of spacers below the first inverted mask opening;
    providing a second semiconductor block stack comprising a second plurality of spacers on top of a second TiN layer and a second organic planarization layer on top of the second plurality of spacers,
    depositing a second SiARC layer on top of the semiconductor structure;
    forming a second inverted mask on the semiconductor structure, the second inverted mask including a second inverted mask opening,
    eroding the portion of the plurality of spacers below the second inverted mask opening; and
    depositing a second fill material masking the portion of the second plurality of spacers below the second inverted mask opening.

10. The method of claim 9, wherein the first fill material and the second fill material are the same material.

11. The method of claim 9, wherein the second fill material has an etch selectivity ratio for the organic planarization layer to fill material of 1:4 in an organic RIE.

12. The method of claim 9, wherein the second fill material has an etch selectivity ratio for TiN to fill material of 1:20 in a TiN RIE.

13. The method of claim 9, wherein the second fill material comprises SiTH.

14. A method of making a semiconductor structure comprising:
    providing a semiconductor structure comprising a plurality of spacers on a bottom titanium nitride (TiN) layer,
    depositing on the plurality of spacers:
        a bottom organic planarization layer (OPL),
        a top TiN layer,
        an LTO mask,
        a top organic planarization layer (OPL), and
        a top silicon antirelective coating (SiARC) layer;
    patterning a first mask on the semiconductor structure, the first mask defining a first unmasked region;
    opening the semiconductor structure to the top TiN layer in the first unmasked region and removing the top SiARC layer;
    replacing the top organic planarization layer (OPL) with a second top organic planarization layer (OPL);
    depositing a second top SiARC layer on the semiconductor structure;
    patterning a second mask on the semiconductor structure, the first mask and second mask defining a second unmasked region;
    etching the bottom TiN layer in the second unmasked region.

15. The method of claim 14, further comprising etching the top TiN layer in the second unmasked region.

16. The method of claim 14, further comprising removing the bottom organic planarization layer in the second unmasked region.

17. The method of claim 14, further comprising forming a via.

18. The method of claim 14, further comprising performing short oxide breakthrough etching.

19. The method of claim 14, comprising performing SiARC RIE on at least a portion of the top SiARC layer or at least a portion of the second top SiARC layer.

20. The method of claim 14, comprising performing OPL RIE on the top OPL layer or the second top OPL layer.

* * * * *